(12) United States Patent
Huang et al.

(10) Patent No.: US 12,211,696 B2
(45) Date of Patent: *Jan. 28, 2025

(54) METHOD OF MANUFACTURING SEMICONDUCTOR STRUCTURE WITH IMPROVED ETCHING PROCESS

(71) Applicant: NANYA TECHNOLOGY CORPORATION, New Taipei (TW)

(72) Inventors: Zhi-Yi Huang, Taoyuan (TW); Ying-Cheng Chuang, Taoyuan (TW); Tsung-Cheng Chen, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 271 days.

This patent is subject to a terminal disclaimer.

(21) Appl. No.: 17/898,062

(22) Filed: Aug. 29, 2022

(65) Prior Publication Data

US 2024/0071769 A1 Feb. 29, 2024

(51) Int. Cl.
*H01L 21/306* (2006.01)
*H01L 21/3065* (2006.01)
*H01L 21/308* (2006.01)

(52) U.S. Cl.
CPC ...... *H01L 21/3065* (2013.01); *H01L 21/3086* (2013.01)

(58) Field of Classification Search
CPC .................. H01L 21/3065; H01L 21/3086
USPC .................................................. 438/706–714
See application file for complete search history.

(56) References Cited

U.S. PATENT DOCUMENTS

| 7,585,774 B2 * | 9/2009 | Lee .................. H01L 21/32136 257/E21.516 |
| 9,786,503 B2 | 10/2017 | Raley et al. |
| 2008/0188083 A1 * | 8/2008 | Jeon .................. H01L 21/31116 257/E21.252 |
| 2010/0055922 A1 * | 3/2010 | Kim .................. H01L 21/31144 438/745 |
| 2012/0205810 A1 * | 8/2012 | Kim ...................... H10B 12/485 257/773 |
| 2013/0337652 A1 | 12/2013 | Sun et al. |
| 2016/0043032 A1 | 2/2016 | Wang et al. |

(Continued)

FOREIGN PATENT DOCUMENTS

TW 201342471 A 10/2013

*Primary Examiner* — Duy Vu N Deo
(74) *Attorney, Agent, or Firm* — MUNCY, GEISSLER, OLDS & LOWE, P.C.

(57) ABSTRACT

The present disclosure provides a manufacturing method of a semiconductor structure. The method includes: forming a conformal layer over a first patterned layer over a substrate; forming a second layer over the conformal layer and between portions of the first patterned layer; performing a first etching to form a second patterned layer and a patterned conformal layer; performing a second etching to remove a portion of the first patterned layer to form a first inclined member of the first patterned layer tapered away from the substrate and lining a vertical portion of the patterned conformal layer, and to remove a portion of the second patterned layer to form a second inclined member of the second patterned layer tapered away from the substrate and lining the vertical portion of the patterned conformal layer; and performing a third etching to remove the vertical portions of the patterned conformal layer.

19 Claims, 25 Drawing Sheets

(56) References Cited

U.S. PATENT DOCUMENTS

| | | | |
|---|---|---|---|
| 2016/0093500 A1* | 3/2016 | Renner | H01L 21/3003 |
| | | | 438/710 |
| 2016/0268142 A1* | 9/2016 | Liou | H01L 21/3086 |
| 2017/0338116 A1 | 11/2017 | Devilliers et al. | |
| 2019/0318929 A1 | 10/2019 | Chuang et al. | |
| 2020/0111677 A1 | 4/2020 | Srivastava et al. | |
| 2022/0066328 A1 | 3/2022 | Cha et al. | |

* cited by examiner

METHOD OF MANUFACTURING SEMICONDUCTOR STRUCTURE WITH IMPROVED ETCHING PROCESS

TECHNICAL FIELD

The present disclosure relates to a method of manufacturing a semiconductor structure. Particularly, the present disclosure relates to an improved technique for patterning processes.

DISCUSSION OF THE BACKGROUND

Semiconductor devices are used in a variety of electronic applications, such as personal computers, cellular phones, digital cameras, and other electronic equipment. The semiconductor devices are typically fabricated by sequentially depositing insulating or dielectric layers, conductive layers, and semiconductive layers of material over a semiconductor substrate, and patterning the various material layers using lithography to form circuit components and elements thereon. As the semiconductor industry has progressed into advanced technology process nodes in pursuit of greater device density, higher performance, and lower costs, challenges of precise control of lithography across a wafer have arisen.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of manufacturing a semiconductor structure. The method includes forming a first patterned layer over a substrate; forming a conformal layer over the first patterned layer; forming a second layer over the conformal layer and between portions of the first patterned layer; performing a first etching to remove portions of the second layer and the conformal layer disposed over the first patterned layer, thereby forming a second patterned layer and a patterned conformal layer; performing a second etching to form a first inclined member of the first patterned layer tapered away from the substrate and lining a vertical portion of the patterned conformal layer, and to form a second inclined member of the second patterned layer tapered away from the substrate and lining the vertical portion of the patterned conformal layer; and performing a third etching to remove the vertical portions of the patterned conformal layer.

In some embodiments, the method further includes: providing the substrate; and forming a plurality of recesses in the substrate.

In some embodiments, the plurality of recesses are filled by the conformal layer.

In some embodiments, the method further includes: forming a first layer over the substrate; and removing portions of the first layer to form the first patterned layer.

In some embodiments, the method further includes: forming a first layer over the substrate; and removing portions of the first layer to form the first patterned layer.

In some embodiments, the first patterned layer includes rounded corners.

In some embodiments, the first etching stops when the rounded corners of the first patterned layer are entirely removed.

In some embodiments, rounded corners of the conformal layer are disposed over the rounded corners of the first patterned layer.

In some embodiments, the first etching stops when the rounded corners of the conformal layer are entirely removed.

In some embodiments, the first etching is a low-selectivity etching.

In some embodiments, the second etching or the third etching is a high-selectivity etching.

In some embodiments, a first etching rate of the low-selectivity etching to the first patterned layer is substantially equal to a second etching rate of the low-selectivity etching to the conformal layer.

In some embodiments, the first inclined member and the second inclined member are removed by the third etching.

In some embodiments, a top surface of the first patterned layer is substantially coplanar with a top surface of the second patterned layer after the third etching.

Another aspect of the present disclosure provides a method of manufacturing a semiconductor structure. The method includes forming a first patterned layer over a substrate; forming a second patterned layer over the substrate and alternately arranged with the first patterned layer; forming a patterned conformal layer disposed between the first patterned layer and the second patterned layer, wherein top surfaces of the first patterned layer, the patterned conformal layer, and the second patterned layer are substantially coplanar; forming a first recess extending into the first patterned layer and surrounded by the patterned conformal layer; removing vertical portions of the patterned conformal layer; and planarizing top surfaces of the first patterned layer and the second patterned layer.

In some embodiments, the method further includes: forming a plurality of recesses on the substrate prior to the formation of the first patterned layer; and forming a conformal layer prior to the formation of the second patterned layer, wherein the conformal layer is conformal to the substrate and the first patterned layer.

In some embodiments, sidewalls of the first patterned layer are substantially aligned with sidewalls of the plurality of recesses on the substrate.

In some embodiments, at least a portion of the patterned conformal layer is disposed below the first patterned layer.

In some embodiments, the method further includes: forming a second recess extending into the second patterned layer, concurrently with the formation of the first recess.

In some embodiments, the first recess is formed by a dry etching.

In some embodiments, the removal of the vertical portions of the patterned conformal layer and the planarizing of the top surfaces of the first patterned layer and the second patterned layer are performed concurrently.

In some embodiments, a directional dry etching is performed to remove the vertical portions of the patterned conformal layer and to planarize the top surfaces of the first patterned layer and the second patterned layer.

In some embodiments, the directional dry etching has a high selectivity to the patterned conformal layer.

In some embodiments, the second patterned layer is separated from the first patterned layer by a plurality of gaps and from the substrate by the patterned conformal layer after the planarization.

In some embodiments, the first patterned layer includes a first height substantially equal to a height of the patterned conformal layer and a second height substantially less than the height of the patterned conformal layer.

In some embodiments, the first patterned layer and the second patterned layer include a same material.

In some embodiments, the patterned conformal layer includes a material different from that of the first patterned layer or the second patterned layer.

Another aspect of the present disclosure provides a method of manufacturing a semiconductor structure. The method includes providing a substrate; forming a first layer over the substrate; patterning the first layer to form a first patterned layer and to expose portions of the substrate; forming a conformal layer over the first patterned layer and the substrate; forming a second layer over the conformal layer, wherein the second layer at least fills between different portions of the first patterned layer; removing portions of the conformal layer and the second layer disposed over the first patterned layer to form a patterned conformal layer and a second patterned layer, wherein top surfaces of the first patterned layer, the second patterned layer and the patterned conformal layer are substantially coplanar; performing a first etching to form a first recess on the first patterned layer and a second recess on the second patterned layer, wherein each of the first recess and the second recess is surrounded by the patterned conformal layer; and performing a second etching to remove portions of the patterned conformal layer to separate the first patterned layer and the second patterned layer by a plurality of gaps.

In some embodiments, the method further includes: transferring a pattern of the first patterned layer and the second patterned layer to the substrate.

In some embodiments, the pattern is transferred to a topmost layer of the substrate.

In some embodiments, a top surface of the substrate is substantially planar.

In some embodiments, a horizontal portion of the conformal layer is in contact with the substrate.

In some embodiments, the first layer or the second layer includes oxide.

In some embodiments, the conformal layer includes nitride.

In some embodiments, a total thickness of the second patterned layer and the conformal layer is substantially greater than a thickness of the first patterned layer.

In some embodiments, the method further includes: forming a sacrificial layer over the second layer, wherein a top surface of the sacrificial layer is substantially planar.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
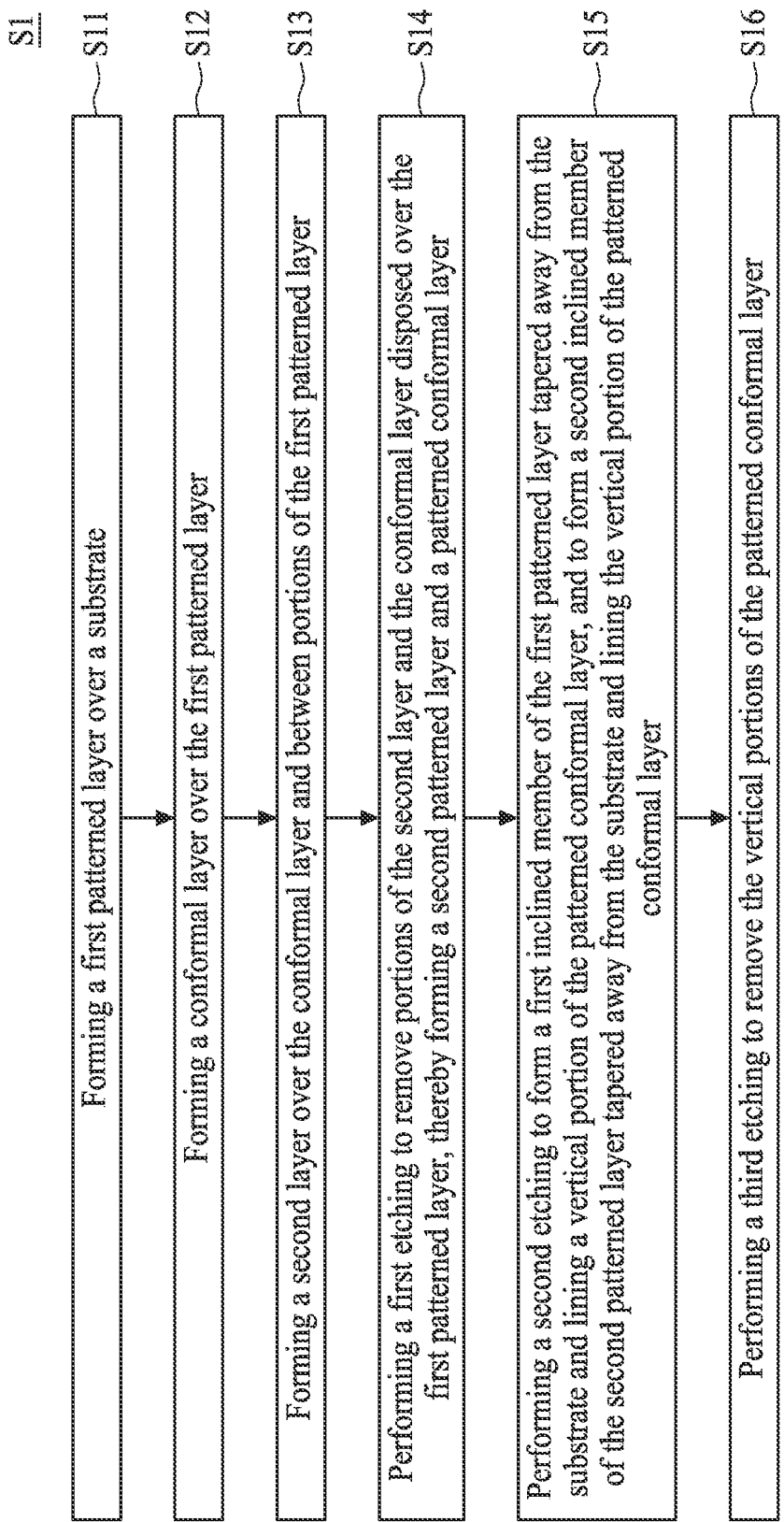
FIG. 1 is a flow diagram illustrating a method of manufacturing a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As the semiconductor industry has progressed into advanced technology process nodes in pursuit of greater device density, it has reached an advanced precision of photolithography. In order to further reduce device sizes, a double patterning technique has been developed in which multiple hard layers are patterned at a same elevation to compose one pattern to be transferred to a target layer. The multiple hard layers undergo multiple operations, such as deposition, etching, planarization and so forth, and the pattern formed by the multiple hard layers may have an uneven top surface after the multiple operations. The uneven top surfaces of the pattern result in an uneven etching result on the target layer. The present disclosure relates to a method for manufacturing a semiconductor structure. In particular, the method of the present disclosure is able to provide a planar surface of a pattern so as to avoid the uneven etching result. A performance of a device formed according to the method and a product yield can be thereby improved.

FIG. 1 is a flow diagram illustrating a method S1 for manufacturing a semiconductor device in accordance with some embodiments of the present disclosure. The method S1 includes a number of operations (S11, S12, S13, S14, S15 and S16) and the description and illustration are not deemed as a limitation to the sequence of the operations. In the operation S11, a first patterned layer is formed over a substrate. In the operation S12, a conformal layer is formed over the first patterned layer. In the operation S13, a second layer is formed over the conformal layer and between portions of the first patterned layer. In the operation S14, a first etching is performed to remove portions of the second layer and the conformal layer disposed over the first patterned layer, thereby forming a second patterned layer and a patterned conformal layer. In the operation S15, a second etching is performed to form a first inclined member of the first patterned layer tapered away from the substrate and lining a vertical portion of the patterned conformal layer, and to form a second inclined member of the second patterned layer tapered away from the substrate and lining the vertical portion of the patterned conformal layer. In the operation S16, a third etching is performed to remove the vertical portions of the patterned conformal layer.

Figure 2:
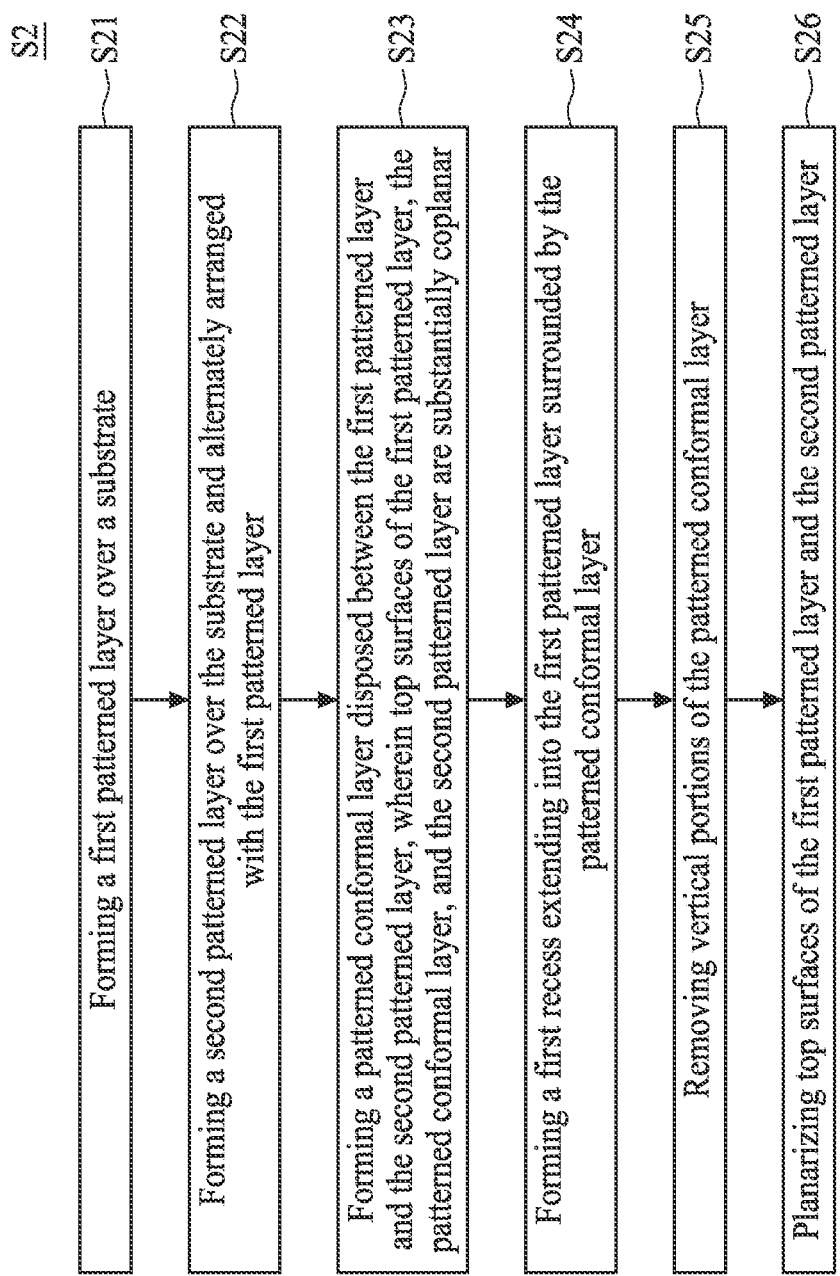
FIG. 2 is a flow diagram illustrating a method of manufacturing a semiconductor structure in accordance with some embodiments of the present disclosure.

FIG. 2 is a flow diagram illustrating a method S2 for manufacturing a semiconductor device in accordance with some embodiments of the present disclosure. The method S2 includes a number of operations (S21, S22, S23, S24, S25 and S26) and the description and illustration are not deemed as a limitation to the sequence of the operations. In the operation S21, a first patterned layer is formed over a substrate. In the operation S22, a second patterned layer is formed over the substrate and alternately arranged with the first patterned layer. In the operation S23, a patterned conformal layer is formed between the first patterned layer and the second patterned layer, wherein top surfaces of the first patterned layer, the patterned conformal layer, and the second patterned layer are substantially coplanar. In the operation S24, a first recess is formed extending into the first patterned layer and surrounded by the patterned conformal layer. In the operation S25, vertical portions of the patterned conformal layer are removed. In the operation S26, top surfaces of the first patterned layer and the second patterned layer are planarized.

Figure 3:
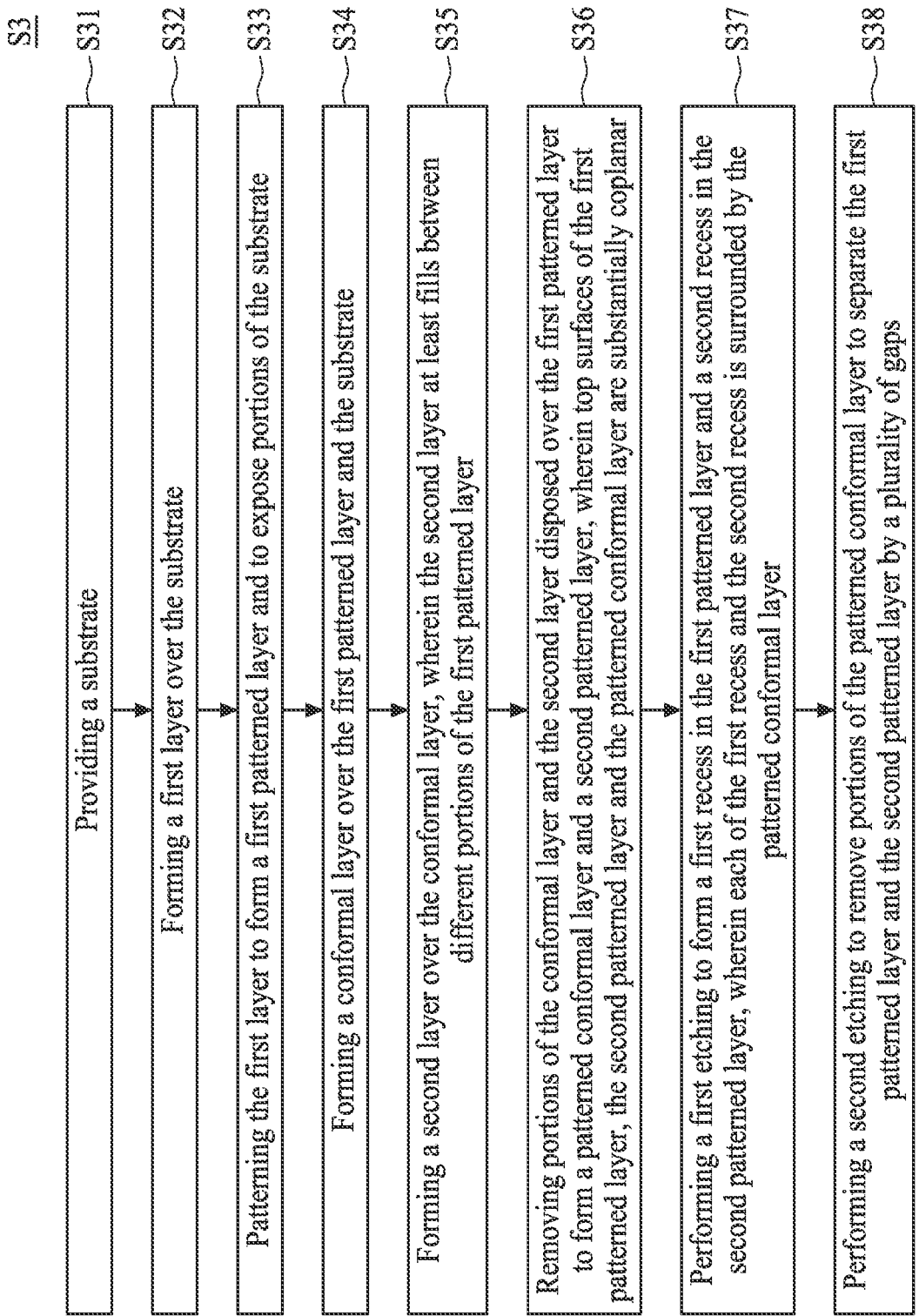
FIG. 3 is a flow diagram illustrating a method of manufacturing a semiconductor structure in accordance with some embodiments of the present disclosure.

FIG. 3 is a flow diagram illustrating a method S3 for manufacturing a semiconductor device in accordance with some embodiments of the present disclosure. The method S3 includes a number of operations (S31, S32, S33, S34, S35, S36, S37 and S38) and the description and illustration are not deemed as a limitation to the sequence of the operations. In the operation S31, a substrate is provided. In the operation S32, a first layer is formed over the substrate. In the operation S33, the first layer is patterned to form a first patterned layer and to expose portions of the substrate. In the operation S34, a conformal layer is formed over the first patterned layer and the substrate. In the operation S35, a second layer is formed over the conformal layer, wherein the second layer at least fills between different portions of the first patterned layer. In the operation S36, portions of the conformal layer and the second layer over the first patterned layer is removed to form a patterned conformal layer and a second patterned layer, wherein top surfaces of the first patterned layer, the second patterned layer and the patterned conformal layer are substantially coplanar. In the operation S37, a first etching is performed to form a first recess in the first patterned layer and a second recess in the second patterned layer, wherein each of the first recess and the second recess is surrounded by the patterned conformal layer. In the operation S38, a second etching is performed to remove portions of the patterned conformal layer to separate the first patterned layer and the second patterned layer by a plurality of gaps.

The method S1, the method S2 and the method S3 are within a same concept of the present disclosure, and in order to further illustrate details of the method S1, the method S2, the method S3, and the concept of the present disclosure, the method S1, the method S2 and the method S3 are comprehensively described with embodiments of the present disclosure.

FIGS. 4 to 19 are schematic diagrams illustrating various fabrication stages constructed according to the method S1, S2 or S3 for manufacturing a semiconductor structure 10 in accordance with some embodiments of the present disclosure. The stages shown in FIGS. 4 to 19 are also illustrated schematically in the process flow in FIG. 1, 2 or 3. In the subsequent discussion, the fabrication stages shown in FIGS. 4 to 16 are discussed in reference to the process steps in FIG. 1, 2 or 3.

Figure 4:
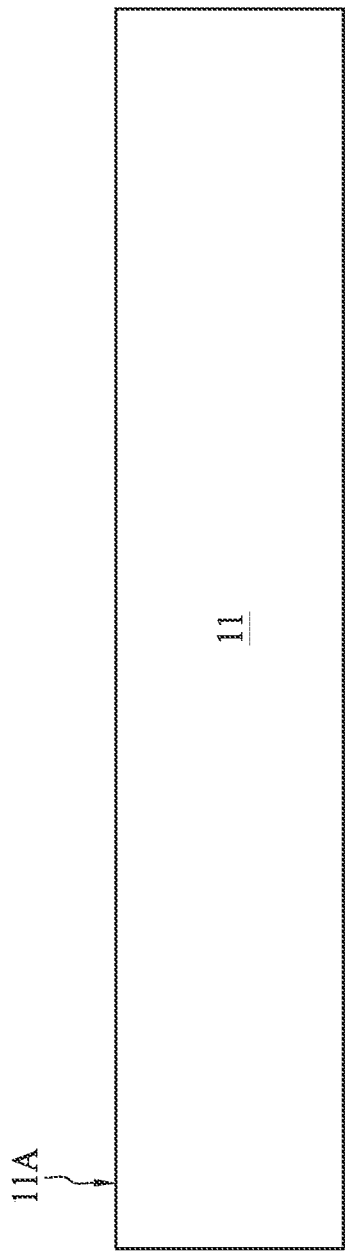
FIGS. 4 to 14 are cross-sectional diagrams of intermediate stages in the formation of a semiconductor structure in accordance with some embodiments of the present disclosure.

Referring to FIG. 4, FIG. 4 is a schematic cross-sectional diagram at a stage of the method S1, the method S2 and/or the method S3 in accordance with some embodiments of the present disclosure. Prior to the operation S11, the operation S21 and/or in the operation S31, a substrate 11 is provided, received, or formed.

The substrate 11 may be a semiconductor substrate, such as a bulk semiconductor, a semiconductor-on-insulator (SOI) substrate, or the like. The substrate 11 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Si:Ge feature in which Si and Ge compositions change from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

In some embodiments, the substrate 11 may have a multilayer structure, or the substrate 11 may include a multilayer compound semiconductor structure. In some embodiments, the substrate 11 includes semiconductor devices, electrical components, electrical elements or a combination thereof. In some embodiments, the substrate 11 includes transistors or functional units of transistors. For a purpose of simplicity, the substrate 11 depicted in FIG. 4 can be a topmost layer of a multilayer structure of the substrate 11. In some embodiments, the topmost layer of the substrate 11 includes crystalline silicon.

Figure 5:
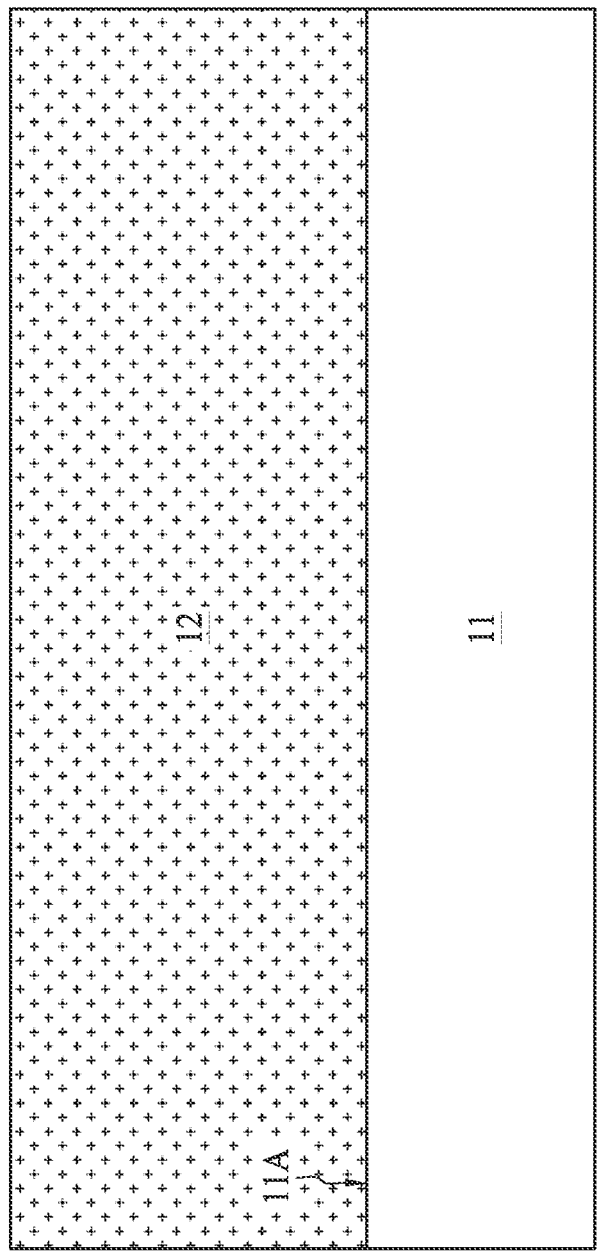

Referring to FIG. 5, FIG. 5 is a schematic cross-sectional diagram at a stage of the method S1, the method S2 and/or the method S3 in accordance with some embodiments of the present disclosure. After the substrate 11 is provided, received or formed, prior to the operation S11, prior to the operation S12 and/or in the operation S32, a first layer 12 is formed over the substrate 11. In some embodiments, the first layer 12 is formed over a top surface 11A of the substrate 11. In some embodiments, a thickness of the first layer 12 is in a range of 50 to 500 nanometers (nm). In some embodiments, the first layer 12 includes one or more dielectric materials. In some embodiments, the dielectric material includes silicon oxide ($SiO_x$), silicon nitride ($Si_xN_y$), silicon oxynitride (SiON), or a combination thereof. In some embodiments, the first layer 12 includes silicon dioxide ($SiO_2$).

In some embodiments, the dielectric material includes a polymeric material, an organic material, an inorganic material, a photoresist material or a combination thereof. In some embodiments, the dielectric material includes one or more low-k dielectric materials having a dielectric constant (k value) less than 3.9. In some embodiments, the low-k dielectric material includes fluorine-doped silicon dioxide, organosilicate glass (OSG), carbon-doped oxide (CDO), porous silicon dioxide, spin-on organic polymeric dielectrics, spin-on silicon based polymeric dielectrics, or a combination thereof. In some embodiments, the dielectric material includes one or more high-k dielectric materials having a dielectric constant (k value) greater than 3.9. The high-k dielectric material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure.

In some embodiments, the first layer 12 is a metal-containing layer. In some embodiments, the first layer 12 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), other applicable conductive materials, oxides of the above-mentioned metals, or a combination thereof.

In some embodiments, the first layer 12 is formed by a blanket deposition. In some embodiments, the first layer 12 is formed by a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof.

Figure 6:
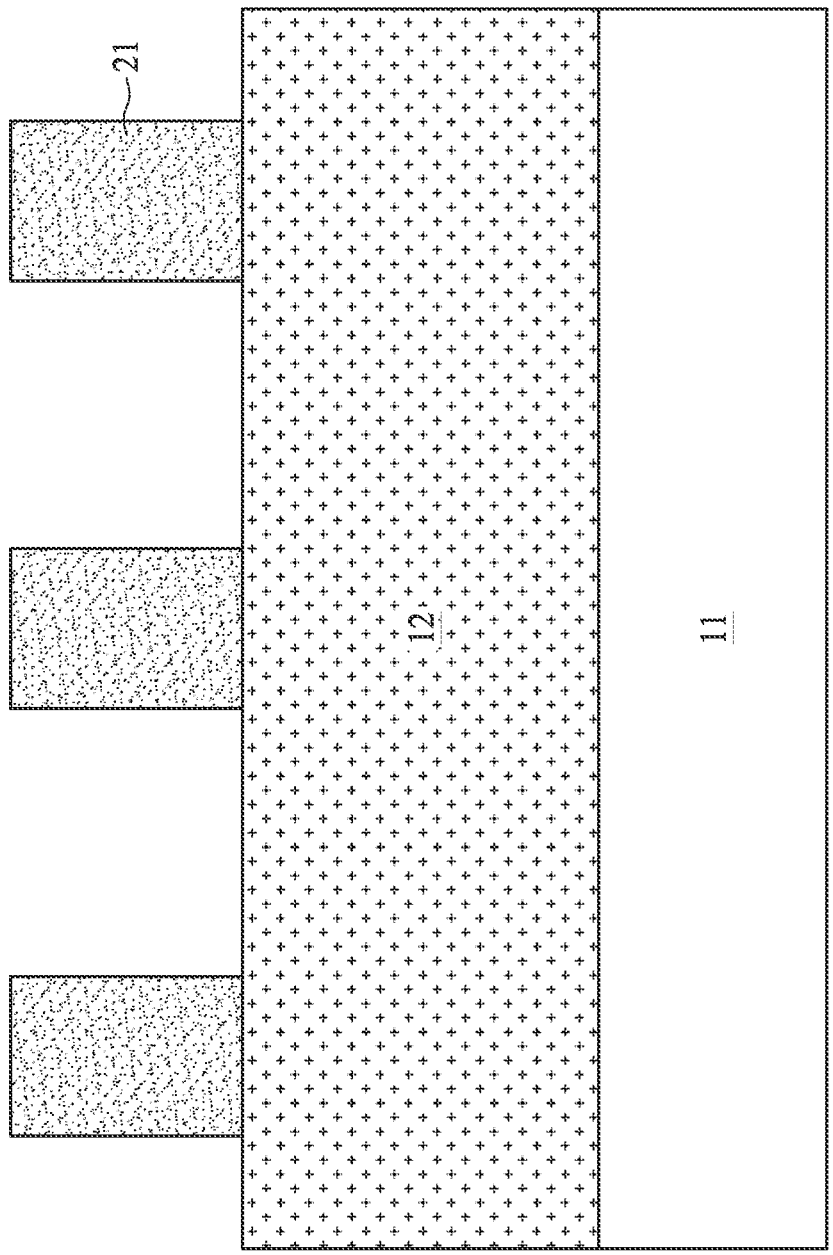

Referring to FIG. 6, FIG. 6 is a schematic cross-sectional diagram at a stage of the method S1, the method S2 and/or the method S3 in accordance with some embodiments of the present disclosure. Prior to the operation S11, the operation S21 and/or the operation S33, a photoresist layer 21 is formed over the first layer 12. In some embodiments, portions of the first layer 12 are defined by and exposed through the photoresist layer 21. The photoresist layer 21 is configured to protect portions of the first layer 12 covered by the photoresist layer 21 during a patterning operation that is subsequently performed.

Figure 7:
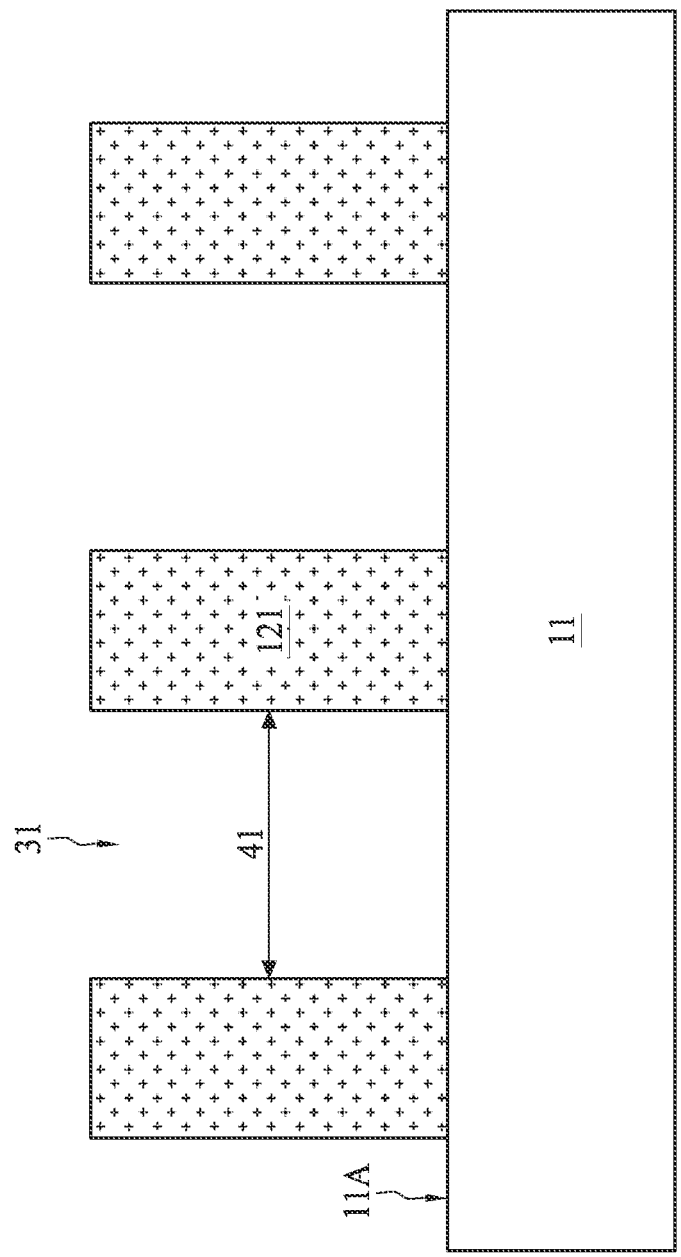

Referring to FIG. 7, FIG. 7 is a schematic cross-sectional diagram at a stage of the method S1, the method S2 and/or the method S3 in accordance with some embodiments of the present disclosure. In the operation S11, the operation S21 and/or the operation S33, the first layer 12 is patterned to expose portions of the substrate 11 and form a first patterned layer 121, wherein the first patterned layer 121 includes a plurality of portions as shown in FIG. 7, and at least one opening 31 is defined between adjacent portions of the first patterned layer 121.

In some embodiments, the patterning of the first layer 12 includes lift-off, ion beam etching, directional dry etching, reactive ion etching, solution wet etching, or a combination thereof. In some embodiments, the first patterned layer 121 is defined by the photoresist layer 21 shown in FIG. 6. In some embodiments, after the formation of the first layer 12, pre-cleaning, photoresist application (formation of the photoresist layer 21), exposure, developing and etching are sequentially performed to form the first patterned layer 121.

Figure 8:
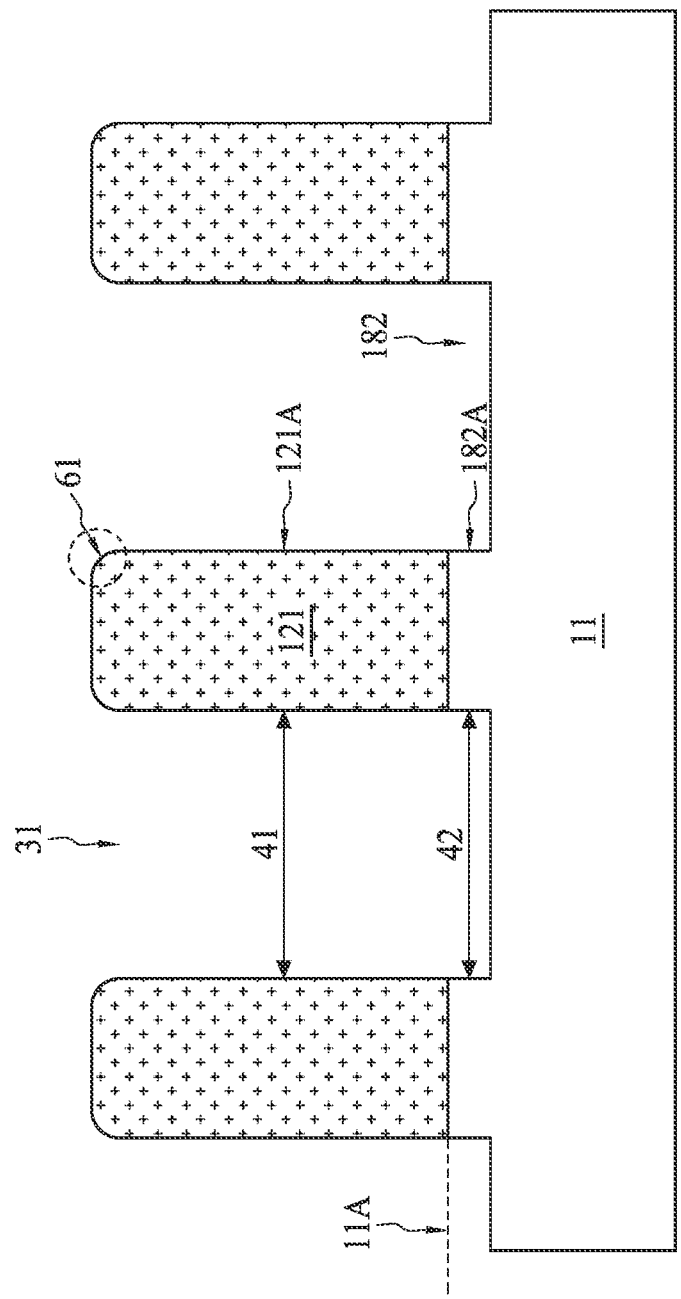

Referring to FIG. 8, FIG. 8 is a schematic cross-sectional diagram at a stage of the method S1, the method S2 and/or the method S3 in accordance with some embodiments of the present disclosure. After the operation S11, the operation S21 and/or the operation S33, surficial portions of the substrate 11 exposed through the first patterned layer 121 are removed to form at least one recess 182 extending from the top surface 11A into the substrate 11. In some embodiments, the recess 182 is connected to the opening 31. In some embodiments, a sidewall 121A of the first patterned layer 121 is substantially aligned with a sidewall 182A of the recess 182. In some embodiments, a distance 41 between adjacent portions of the first patterned layer 121 defines a width 42 of the recess 182.

In some embodiments, corner portions of the first patterned layer 121 shown in FIG. 7 are removed concurrently with the formation of the recess 182. In some embodiments, rounded corners 61 of the first patterned layer 121 are formed concurrently with the formation of the recess 182. In some embodiments, the recess 182 can be formed prior to the formation of the first layer 12 or after the formation of the first patterned layer 121. In some embodiments, the recess 182 is formed by an ion beam etching, a directional dry etching, a reactive ion etching, a solution wet etching, or a combination thereof. It should be noted that, in other manufacturing methods of different applications, the formation of the recess 182 may be omitted. In some embodiments, the recess 182 is formed if the method S1, S2 or S3 is applied in formation of a memory device. In some embodiments without the formation of the recess 182, the subsequent process of the method S1, S2 and/or S3 is performed on the interim structure as shown in FIG. 7.

Figure 9:
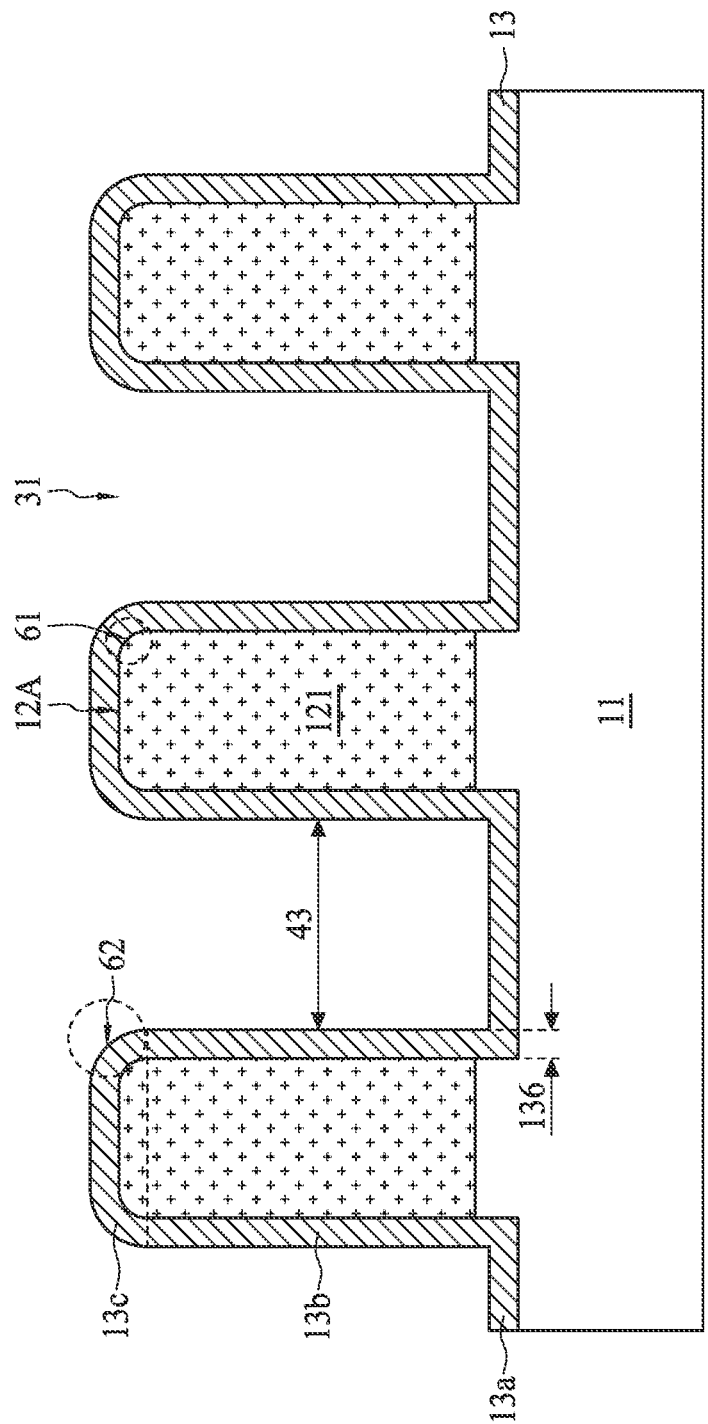

Referring to FIG. 9, FIG. 9 is a schematic cross-sectional diagram at a stage of the method S1, the method S2 and/or the method S3 in accordance with some embodiments of the present disclosure. In the operation S12, prior to the operation S22, and/or in the operation S34, a conformal layer 13 is formed over the first patterned layer 121 and the substrate 11. In some embodiments, a profile of the conformal layer 13 is conformal to a profile of the first patterned layer 121 and the substrate 11. In some embodiments, the conformal layer 13 includes rounded corners 62 disposed over the rounded corners 61 of the first patterned layer 121.

In some embodiments, the conformal layer 13 includes horizontal portions 13a lining the top surface 11A of the substrate 11, upper portions 13c lining a top surface 12A and the rounded corners 61 of the first patterned layer 121, and vertical portions 13b connecting the horizontal portions 13a and the upper portions 13c. For a purpose of illustration, a dashed line is depicted in FIG. 9 to indicate an intersection between the vertical portion 13b and the upper portion 13c. In some embodiments, the conformal layer 13 lines the openings 31. In some embodiments, the conformal layer 13 lines sidewalls of portions of the first patterned layer 121 and portions of the top surface 11A of the substrate 11 in the openings 31. In some embodiments, the conformal layer 13 is in contact with the top surface 12A of the first patterned layer 121, the sidewall 121A of the first patterned layer 121, and the top surface 11A of the substrate 11. In some embodiments, at least the horizontal portions 13a are disposed in the recess 182. The horizontal portions 13a of the conformal layer 13 may be partially or entirely below the first patterned layer 121 depending on a depth of the recess 182 and a thickness 136 of the conformal layer 13. In some embodiments, the thickness 136 of the conformal layer 13 is configured to define a distance (or a width of a gap) between adjacent portions of a patterned layer of the substrate 11 to be formed. In some embodiments, the thickness 136 is substantially consistent throughout the entire conformal layer 13. In some embodiments, an entirety of the horizontal portions 13a is disposed in the recess 182. In some embodiments, a distance 43 between adjacent vertical portions 13b in the opening 31 is configured to define a width of a second patterned layer to be formed later in the process.

In some embodiments, the conformal layer 13 is formed by a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof. In some embodiments, the conformal layer 13 includes one or more dielectric materials. The dielectric material of the conformal layer 13 may be selected from the dielectric materials described in reference to the first layer 12, and repeated description is omitted herein. In some embodiments, the dielectric material of the conformal layer 13 is different from that of the first patterned layer 121 for a purpose of etching to be performed later in the process. In some embodiments, the first patterned layer 121 includes oxide, and the conformal layer 13 includes nitride. In some embodiments, a thickness of the conformal layer 13 is in a range of 5 to 50 nm. In some embodiments, the thickness of the conformal layer 13 is substantially consistent throughout the entire conformal layer 13.

Figure 10:
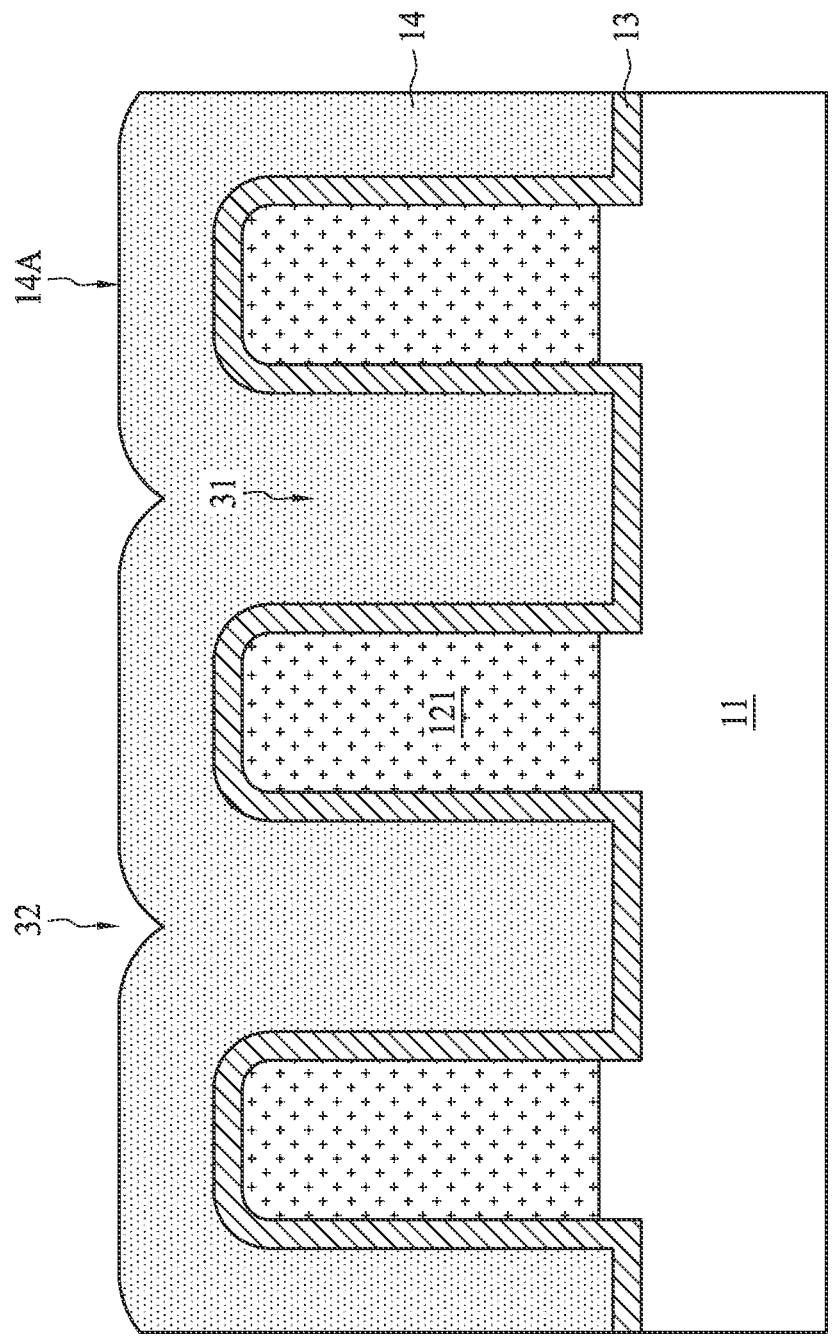

Referring to FIG. 10, FIG. 10 is a schematic cross-sectional diagram at a stage of the method S1, the method S2 and/or the method S3 in accordance with some embodiments of the present disclosure. In the operation S13, prior to the operation S22 and/or prior to the operation S35, a second layer 14 is formed over the conformal layer 13. In some embodiments, the second layer 14 is formed by a blanket deposition. In some embodiments, the second layer 14 at least fills the openings 31. In some embodiments, the second layer 14 is disposed over the first patterned layer 121 and between portions of the first patterned layer 121. In some embodiments, a thickness of the second layer 14 is substantially greater than one-half of the distance 43 for a purpose of filling the opening 31. In some embodiments, the thickness of the second layer 14 is substantially greater than a thickness of the first layer 12. In some embodiments, a top surface 14A of the second layer 14 is not a planar surface. In some embodiments, the top surface 14a of the second layer 14 includes a plurality of recesses 32 disposed on each of the openings 31 due to a property of a deposition. In some embodiments, the recess 32 is vertically over a central region of a corresponding opening 31.

In some embodiments, a portion of the second layer 14 is disposed in the recess 182. In some embodiments, the second layer 14 is entirely above the recess 182 or the substrate 11. In some embodiments, the formation of the second layer 14 includes a chemical vapor deposition (CVD), a physical vapor deposition (PVD), or a combination thereof. In some embodiments, the second layer 14 includes one or more dielectric materials. The dielectric material of the second layer 14 may be selected from the dielectric materials described in reference to the first layer 12, and repeated description is omitted herein. In some embodiments, the dielectric material of the second layer 14 is the same as that of the first patterned layer 121 for a purpose of etching to be performed later in the process. In some embodiments, the second layer 14 includes oxide.

Figure 11:
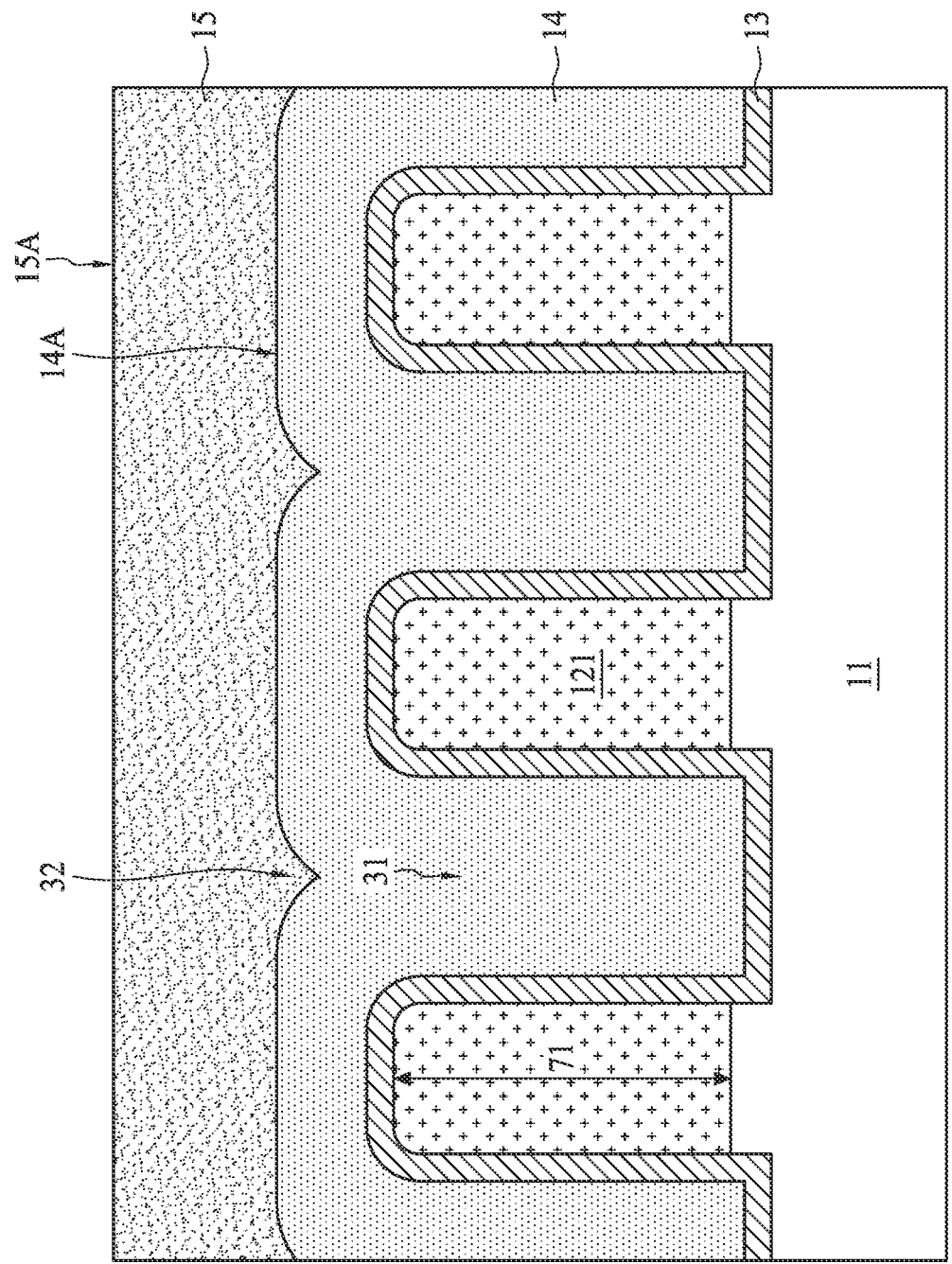

Referring to FIG. 11, FIG. 11 is a schematic cross-sectional diagram at a stage of the method S1, the method S2 and/or the method S3 in accordance with some embodiments of the present disclosure. Prior to the operation S14, prior to the operation S22 and/or prior to the operation S36, a sacrificial layer 15 is formed over the second layer 14. In some embodiments, the sacrificial layer 15 is in physical contact with the top surface 14A of the second layer 14. In some embodiments, the sacrificial layer 15 fills the recesses 32. In some embodiments, a top surface 15A of the sacrificial layer 15 is substantially planar. In some embodiments, the sacrificial layer 15 is configured to provide a planar surface for an etching operation to be performed in the subsequent processing in order to provide a better etching result. In some embodiments, the sacrificial layer 15 includes a dielectric material, an anti-reflective coating material, an oxide-containing material, or other suitable materials.

Figure 12:
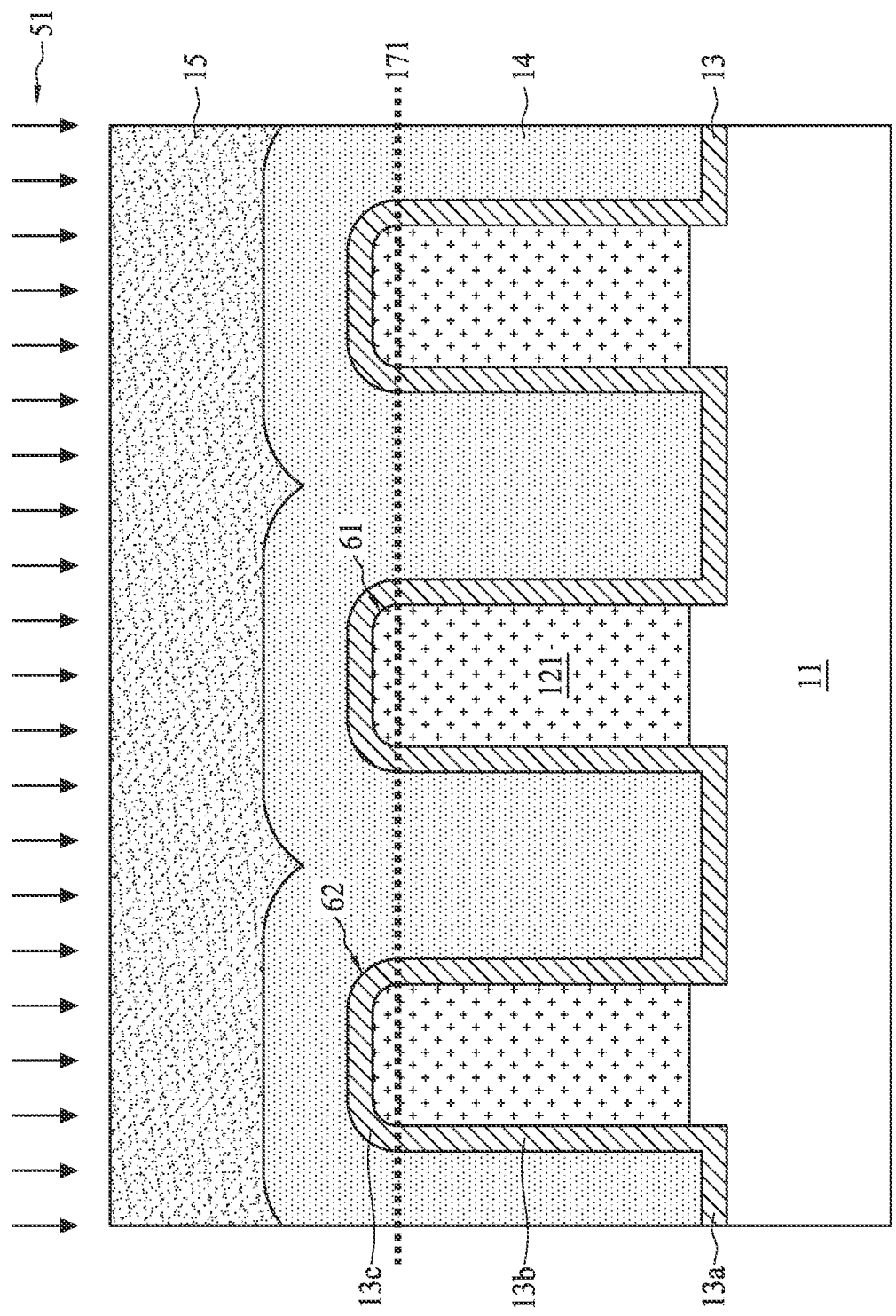

Referring to FIG. 12, FIG. 12 is a schematic cross-sectional diagram at a stage of the method S1, the method S2 and/or the method S3 in accordance with some embodiments of the present disclosure. In the operation S14, the operation S23 and/or prior to the operation S36, a first etching 51 is performed to remove upper portions of the first patterned layer 121, portions of the conformal layer 13, and portions of the second layer 14. In some embodiments, the first etching 51 includes ion beam etching, directional dry etching, reactive ion etching, solution wet etching, or a combination thereof. In some embodiments, the first etching operation 51 includes a low-selectivity etching. In some embodiments, the low-selectivity etching includes a low etching selectivity between two of the sacrificial layer 15, the second layer 14, the conformal layer 13, and the first patterned layer 121. In some embodiments, the low-selectivity etching includes an etching rate to the second layer 14 substantially equal to an etching rate to the conformal layer 13. In some embodiments, the etching rate of the low-selectivity etching to the conformal layer 13 is substantially equal to an etching rate of the low-selectivity etching to the first patterned layer 121. In some embodiments, the low-selectivity etching includes an oxide to nitride selectivity less than 3. In some embodiments, a detection of a material of the conformal layer 13 at an etched surface is performed after a certain duration of the first etching. A result of the detection can indicate the exposure of the first patterned layer 121.

In some embodiments, the first etching 51 stops when the rounded corners 61 of the first patterned layer 121 are entirely removed. In some embodiments, the first etching 51 stops when the rounded corners 62 of the conformal layer 13 are entirely removed. In some embodiments, the first etching 51 stops at a line 171. In some embodiments, the line 171 is at or below a bottom of the rounded corners 62 of the conformal layer 13. In some embodiments, the line 171 is at or below the intersection (as indicated in FIG. 7) of the upper portion 13c and the vertical portion 13b.

Figure 13:
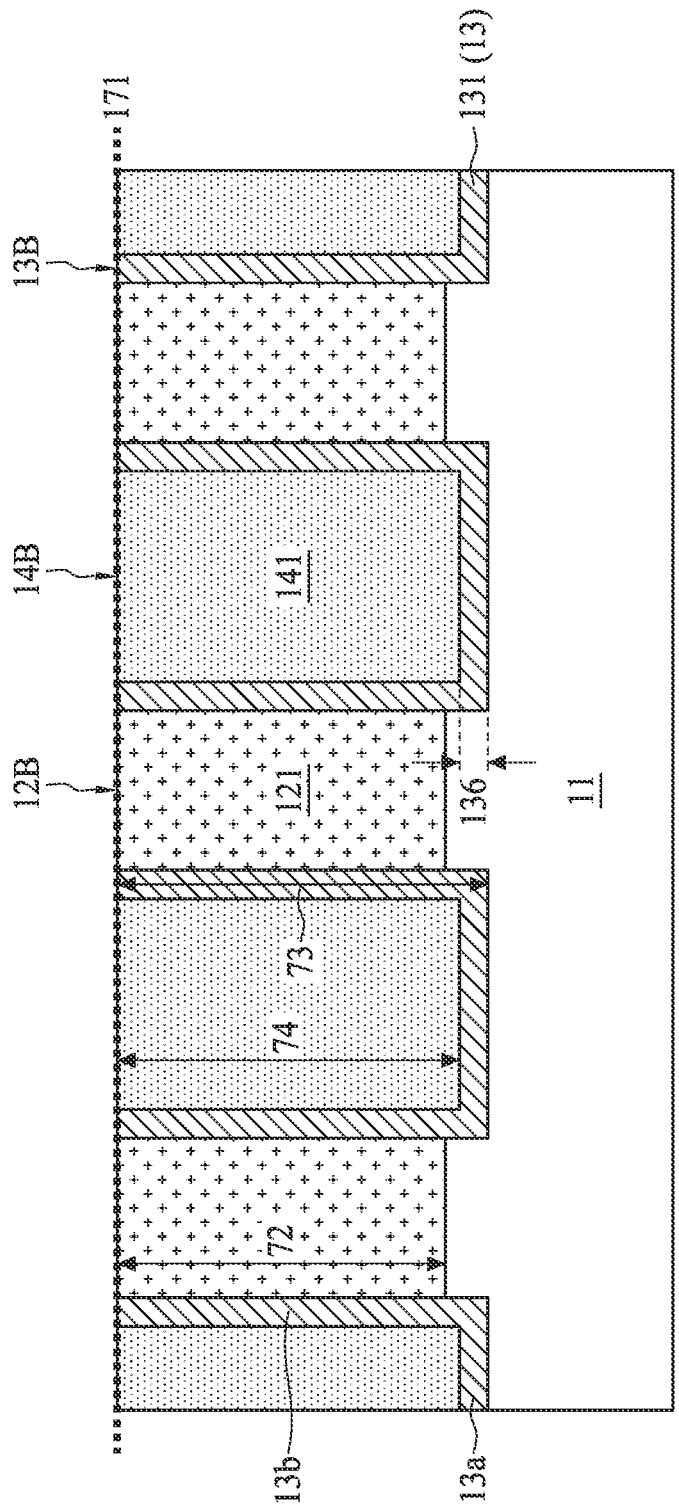

Referring to FIG. 13, FIG. 13 is a schematic cross-sectional diagram at a stage of the method S1, the method S2 and/or the method S3 in accordance with some embodiments of the present disclosure. FIG. 13 shows a resulting structure of the first etching 51. In some embodiments, the sacrificial layer 15 is entirely removed by the first etching 51. In some embodiments, portions of the second layer 14 over the first patterned layer 121 shown in FIG. 12 are removed by the first etching 51 to form a second patterned layer 141. In some embodiments, the upper portions 13c shown in FIG. 12 of the conformal layer 13 are removed by the first etching 51 to form a patterned conformal layer 131. In some embodiments, an entirety of the upper portions 13c of the conformal layer 13 are removed by the first etching 51. As a result, the second patterned layer 141 and the patterned conformal layer 131 are formed. The second patterned layer 141 is alternately arranged with the first patterned layer 121. In some embodiments, the second patterned layer 141 includes portions of the second layer 14 surrounded by the patterned conformal layer 131. In some embodiments, the patterned conformal layer 131 includes the vertical portion 13b and the horizontal portion 13a. In some embodiments, the patterned conformal layer 131 covers only inner surfaces of the openings 31 shown in FIG. 8. In some embodiments, the second patterned layer 141 is separated from the substrate 11 and the first patterned layer 121 by the patterned conformal layer 131. In some embodiments, the second patterned layer 141 is separated from the substrate 11 by the horizontal portions 13a of the patterned conformal layer 131 and from the first patterned layer 121 by vertical portions of the conformal layer 131.

In some embodiments, the upper portions of the first patterned layer 121 having rounded corners 61 as shown in FIG. 12 are removed by the first etching 51. In some embodiments, the rounded corners 61 of the first patterned layer 121 are removed by the first etching 51. In some embodiments, an entirety of the rounded corners 61 of the first patterned layer 121 are removed by the first etching 51. In some embodiments, a thickness 71 of the first patterned layer 121 shown in FIG. 11 prior to the first etching 51 is substantially greater than a thickness 72 of the first patterned layer 121 after the etching 51 shown in FIG. 13. However, the present disclosure is not limited thereto. As mentioned above, the operation shown in FIG. 8 for forming the plurality of recesses 42 in the substrate 11 can be omitted. In some embodiments, as shown in FIG. 7, the first etching 51 may stop at an exposure of the first patterned layer 121, and upper portions of the first patterned layer 121 may be left in place after the first etching 51. In some embodiments, the thickness 71 of the first patterned layer 121 shown in FIG. 11 prior to the first etching 51 is substantially equal to the thickness 72 of the first patterned layer 121 after the etching 51 shown in FIG. 13. In some embodiments, top surfaces 12b, 13b and 14b of the first patterned layer 121, the patterned conformal layer 131 and the second patterned layer 141 respectively are substantially coplanar. In some embodiments, a height 73 of the patterned conformal layer 131 is greater than a thickness 74 of the second patterned layer 141. In some embodiments, a thickness 72 of the first patterned layer 121 is substantially equal to or less than a total thickness of the thickness 74 and the thickness 136 of the patterned conformal layer 131.

Figure 14:
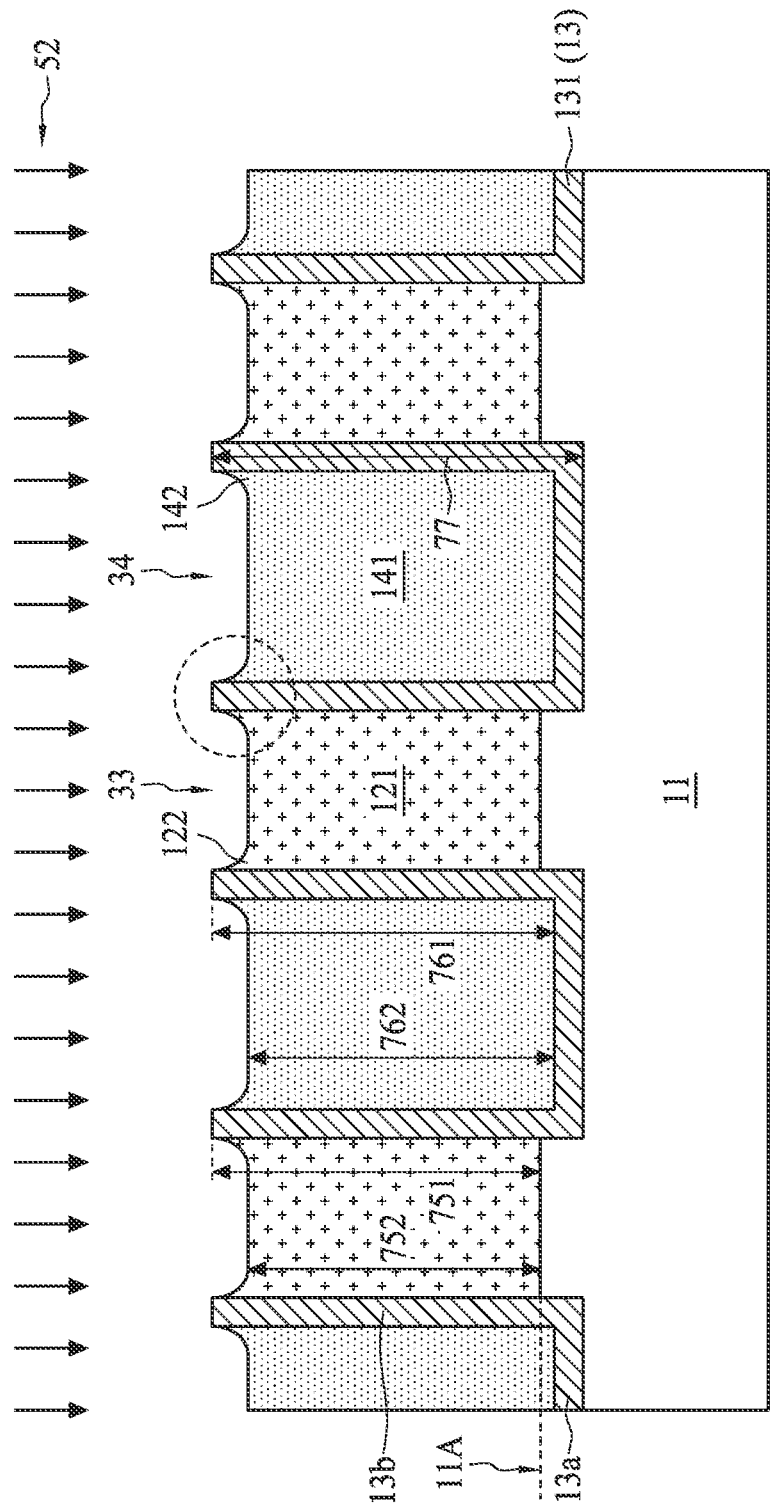

Referring to FIG. 14, FIG. 14 is a schematic cross-sectional diagram at a stage of the method S1, the method S2 and/or the method S3 in accordance with some embodiments of the present disclosure. In the operation S15, the operation S24 and/or prior to the operation S37, a second etching 52 is performed to form a first recess 33 in the first patterned layer 121 and a second recess 34 in the second patterned layer 141. In some embodiments, the first recess 33 is formed in each of the portions of the first patterned layer 121 shown in FIG. 14. In some embodiments, the second recess 34 is formed in each of the portions of the second patterned layer 141. In some embodiments, each of the first recess 33 and the second recess 34 is surrounded by the vertical portions of the patterned conformal layer 131. In some embodiments, the second etching 52 includes an ion beam etching, a directional dry etching, a reactive ion etching, a solution wet etching, or a combination thereof. In some embodiments, the formation of the first recess 33 and the formation of the second recess 34 include one or more directional dry etching operations. In some embodiments wherein the first patterned layer 121 and the second patterned layer 141 include a same material, the second etching 52 may include one etching operation having a high selectivity to the first patterned layer 121 and the second patterned layer 141. In some embodiments wherein the first patterned layer 121 and the second patterned layer 141 include different materials, the second etching 52 may include multiple etching operations, where one etching operation has a high selectivity to the first patterned layer 121 and one etching operation has a high selectivity to the second patterned layer 141. In some embodiments, surficial portions of the vertical portions 13b of the patterned conformal layer 131 are removed. In other words, a height of the vertical portions 13b can be slightly reduced by the second etching 52. In some embodiments, the reduction in the height of the vertical portions 13b of the patterned layer 131 is negligible. In some embodiments, the height of the vertical portions 13b of the patterned layer 131 is consistent prior to and after the second etching 52.

The first recess 33 may be defined by a first inclined member 122 of the first patterned layer 121, and the second recess 34 may be defined by a second inclined member 142 of the second patterned layer 141. In some embodiments, the first inclined member 122 of the first patterned layer 121 is tapered away from the substrate 11. In some embodiments, the second inclined member 142 of the second patterned layer 141 is tapered away from the substrate 11. In some embodiments, each of the vertical portions 13b of the patterned conformal layer 131 is surrounded by the first inclined member 122 and the second inclined member 142. In other words, a first inclined member 122 and an adjacent second inclined member 142 line a same vertical portion 13b of the patterned conformal layer 131. In some embodiments, a first height 751 of the first patterned layer 121 is greater than a second height 752 of the first patterned layer 121, wherein the first height 751 is measured from a top of the first inclined member 122 to the top surface 11A of the substrate 11, and the second height 752 is measured from a bottom of the first recess 33 to the top surface 11A of the substrate 11. In some embodiments, the first height 751 is substantially equal to or less than the thickness 72 shown in FIG. 13. In some embodiments, a first height 761 of the second patterned layer 141 is greater than a second height 762 of the second patterned layer 141, wherein the first height 761 is measured from a top of the second inclined member 142 to the top surface 11A of the substrate 11, and the second height 762 is measured from a bottom of the second recess 34 to the top surface 11A of the substrate 11. In some embodiments, the second height 761 is substantially equal to or less than the height 74 shown in FIG. 13.

Figure 15:
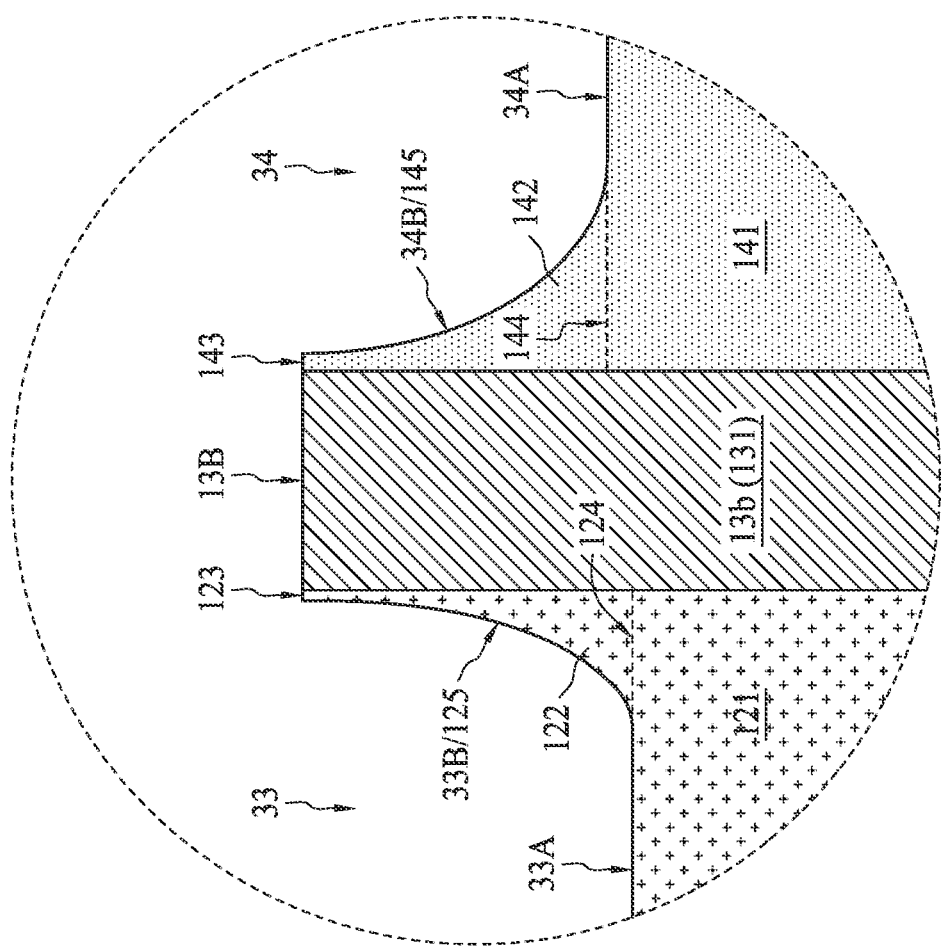
FIGS. 15 and 16 are enlarged schematic diagrams of a dotted region shown in FIG. 14 in accordance with different embodiments of the present disclosure.
Figure 16:
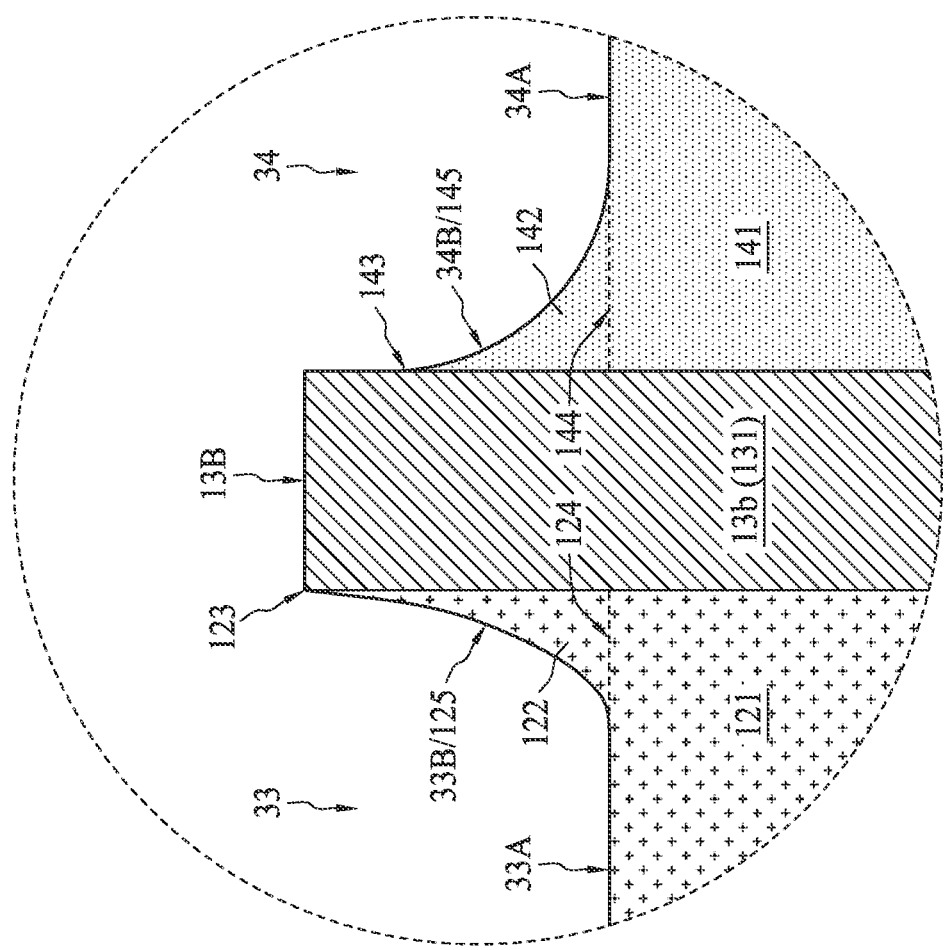

Referring to FIGS. 15 and 16, FIGS. 15 and 16 are enlarged schematic diagrams of a portion of the intermediate structure in a dotted circle indicated in FIG. 14 in accordance with different embodiments of the present disclosure. In some embodiments, a portion of the first patterned layer 121 above a bottom surface 33A of the first recess 33 is defined as the first inclined member 122. In other words, a bottom 124 of the first inclined member 122 is defined by a virtual line (indicated as a dashed line) extending along the bottom surface 33A of the first recess 33. In some embodiments, the first inclined member 122 includes a top 123, the bottom 124, and a first inclined surface 125 connecting the top 123 and the bottom 124. In some embodiments, the first inclined surface 125 defines (or functions as as) an inner sidewall 33B of the first recess 33. In some embodiments, the first inclined surface 125 is a concave surface due to a property of the etching operation. The first inclined surface 125 of the first inclined member 122 may or may not contact the vertical portion 13b of the patterned conformal layer 131. In some embodiments, as shown in FIG. 15, the first inclined surface 125 is separated from the vertical portion 13b of the patterned conformal layer 131. In some embodiments, the top 123 of the first inclined member 122 is a surface, which is a portion of the top surface 12B of the first patterned layer 121 shown in FIG. 13. In such embodiments, the first height 751 (shown in FIG. 14) is substantially equal to the thickness 72 of the first patterned layer 121 (shown in FIG. 13). In some embodiments, as shown in FIG. 16, the first inclined surface 125 contacts the vertical portion 13b of the patterned conformal layer 131. In some embodiments, the top 123 of the first inclined member 122 forms a point, which is a contact point between the first inclined surface 125 and the vertical portion 13b of the patterned conformal layer 131. In such embodiments, the first height 751 (shown in FIG. 14) is substantially equal to or less than the thickness 72 of the first patterned layer 121 (shown in FIG. 13). In some embodiments, as shown in FIG. 16, the first inclined surface 125 contacts the vertical portion 13b at the top surface 13B of the patterned conformal layer 131, and the first height 751 is substantially equal to the thickness 72 of the first patterned layer 121.

Similarly, in some embodiments, a portion of the second patterned layer 141 above a bottom surface 34a of the second recess 34 is defined as the second inclined member 142. In other words, a bottom 144 of the second inclined member 142 is defined by a virtual line (indicated as a dashed line) extending along the bottom surface 34a of the second recess 34. The bottom surface 34a of the second recess 34 may or may not be aligned with the bottom surface 33a of the first recess 33. In some embodiments, as shown in FIG. 15, the bottom surface 33a of the first recess 33 is at an elevation different from an elevation of the bottom surface 34a of the second recess 34. In some embodiments, as shown in FIG. 16, the bottom surface 33a of the first recess 33 is aligned or coplanar with the bottom surface 34a of the second recess 34. In some embodiments, the second inclined member 142 includes a top 143, the bottom 144, and a second inclined surface 145 connecting the top 143 and the bottom 144. In some embodiments, the second inclined surface 145 defines (or serves as) an inner sidewall 34b of the second recess 34. In some embodiments, the second inclined surface 145 is a concave surface due to a property of the etching operation. The second inclined surface 145 of the second inclined member 142 may or may not contact the vertical portion 13b of the patterned conformal layer 131. In some embodiments, as shown in FIG. 15, the second inclined surface 145 is separated from the vertical portion 13b of the patterned conformal layer 131. In some embodiments, the top 143 of the second inclined member 142 is a surface, which is a portion of the top surface 14b of the second patterned layer 141 shown in FIG. 13. In such embodiments, the first height 761 (shown in FIG. 14) is substantially equal to the height 74 of the second patterned layer 141 (shown in FIG. 13). In some embodiments, as shown in FIG. 16, the second inclined surface 145 contacts the vertical portion 13b of the patterned conformal layer 131. In some embodiments, the top 143 of the second inclined member 142 is a point, which is a contact point between the second inclined surface 145 and the vertical portion 13b of the patterned conformal layer 131. In such embodiments, the first height 761 (shown in FIG. 14) is substantially equal to or less than the height 74 of the second patterned layer 141 (shown in FIG. 13). In some embodiments, as shown in FIG. 16, the second inclined surface 145 contacts the vertical portion 13b at a position below the top surface 13B of the patterned conformal layer 131, and the first height 761 is less than the height 74 of the second patterned layer 141.

Figure 17:
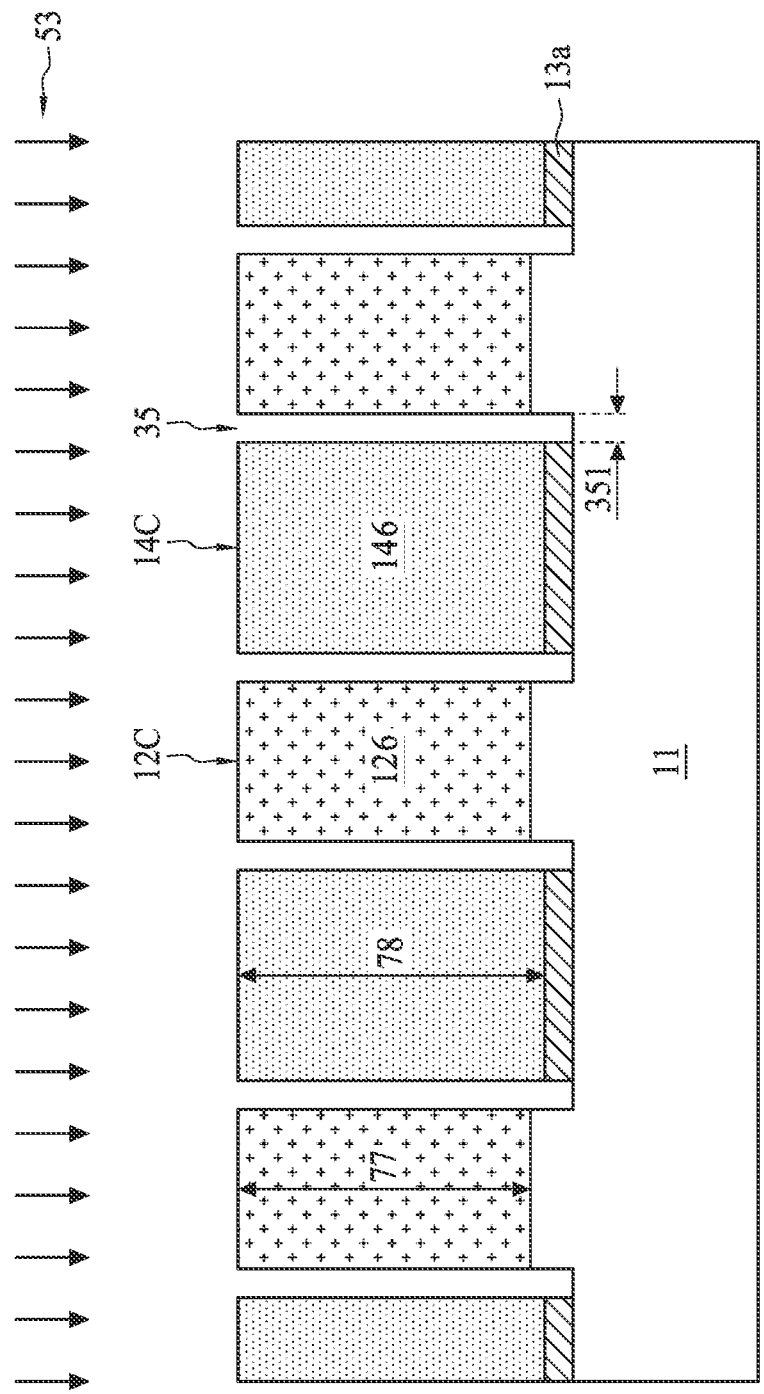
FIGS. 17 to 19 are cross-sectional diagrams of intermediate stages in the formation of a semiconductor structure in accordance with some embodiments of the present disclosure.

Referring to FIG. 17, FIG. 17 is a schematic cross-sectional diagram at a stage of the method S1, the method S2 and/or the method S3 in accordance with some embodiments of the present disclosure. In the operation S16, in the operations S25 and S26, and/or in the operation S38, a third etching 53 is performed to remove the vertical portions 13b of the patterned conformal layer 131. In some embodiments, the vertical portions 13b of the patterned conformal layer 131 are disposed between the first patterned layer 121 and the second patterned layer 141. In some embodiments, the vertical portions 13b of the patterned conformal layer 131 line the sidewalls of different portions of the first patterned layer 121 and/or different portions of the second patterned layer 141. In some embodiments, the third etching 53 includes ion beam etching, directional dry etching, reactive ion etching, solution wet etching, or a combination thereof. In some embodiments, the third etching 53 includes a high-selectivity etching. In some embodiments, the third etching 53 has a high selectivity to the patterned conformal layer 131. In some embodiments, the high selectivity of the third etching 53 includes an oxide to nitride selectivity greater than 10.

As a result, a plurality of gaps 35 are formed between the first patterned layer 121 and the second patterned layer 141. In some embodiments, the second patterned layer 141 is separated from the first patterned layer 121 by the plurality of gaps 35 and from the substrate 11 by the horizontal portions 13a of the patterned conformal layer 131 after the planarization. In some embodiments, the gaps 35 are at positions from which the vertical portions 13b of the patterned conformal layer 131 were previously removed. In some embodiments, the horizontal portions 13a of the patterned conformal layer 131 disposed between the substrate 11 and the second patterned layer 141 remain in place and collectively become a segmental layer 132. In some embodiments, the segmental layer 132 includes a plurality of portions between portions of the second patterned layer 141 and the substrate 11. In some embodiments, different portions of the segmental layer 132 are separated from each other. In some embodiments, portions of the substrate 11 are exposed through the gaps 35. In some embodiments, a width 351 of the gaps 35 is defined by the thickness 136 of the conformal layer 13 shown in FIG. 9. In some embodiments, the width 351 of the gaps 35 is substantially equal to the thickness 136 of the conformal layer 13. In some embodiments, the horizontal portions 13a of the patterned conformal layer 131 disposed between the substrate 11 and the second patterned layer 141 remain in place.

The first inclined member 122 and the second inclined member 142 may be removed concurrently with the removal of the vertical portions 13b of the patterned conformal layer 131 by the third etching 53. For a purpose of illustration, the first patterned layer 121 after the third etching is labelled as 126, and the second patterned layer 141 after the third etching 53 is labelled as 146. In some embodiments, a top surface 12C of the first patterned layer 126 is planarized by the third etching 53. In some embodiments, a top surface 14C of the second patterned layer 146 is planarized by the third etching 53. In some embodiments, the top surfaces 12C and 14C of the first patterned layer 126 and the second patterned layer 146 are planarized concurrently. In some embodiments, the removal of the vertical portions 13b and the planarization of the top surfaces 12C and 14C are performed concurrently by a directional dry etching. In some embodiments, the top surfaces 12C and 14C of the first patterned layer 126 and the second patterned layer 146 are substantially aligned. In some embodiments, the top surfaces 12C and 14C of the first patterned layer 126 and the second patterned layer 146 are substantially coplanar. In some embodiments, a height 77 of the first patterned layer 126 is substantially equal to the height 752 shown in FIG. 14. In some embodiments, a height 78 of the second patterned layer 146 is substantially equal to the height 762 shown in FIG. 14.

Figure 18:
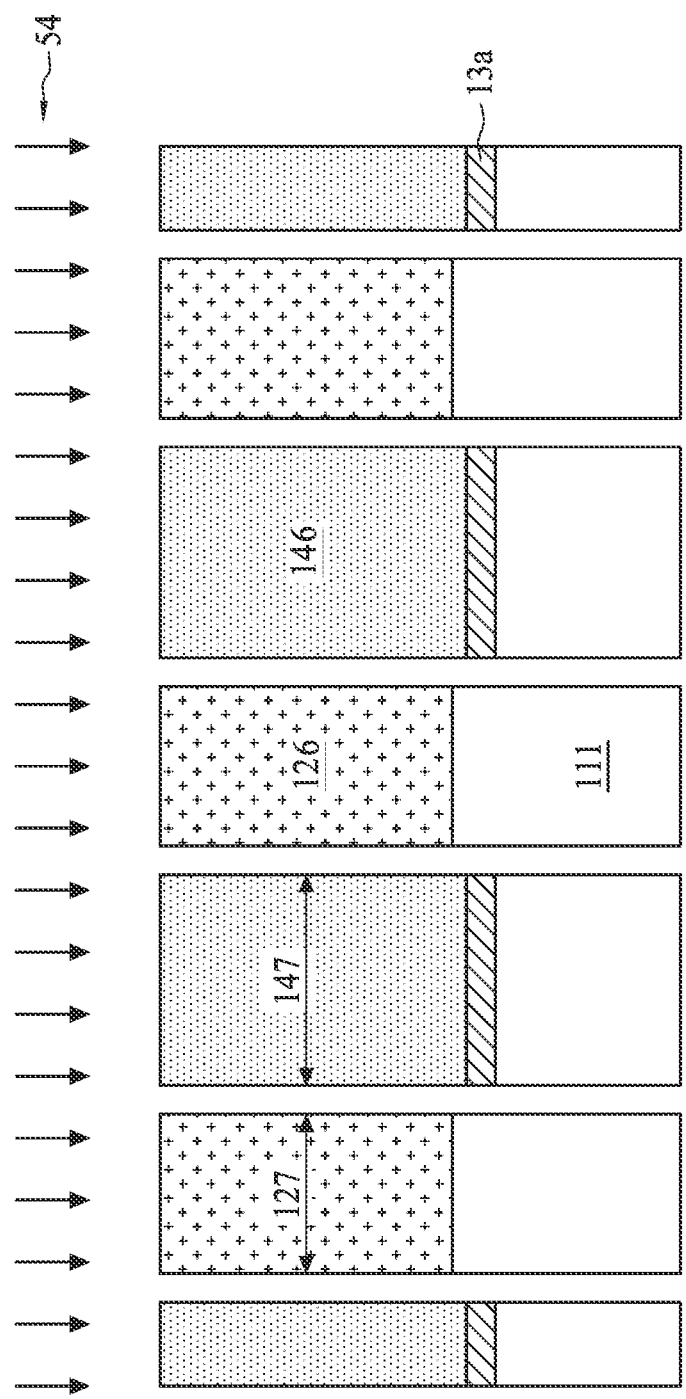

Referring to FIG. 18, FIG. 18 is a schematic cross-sectional diagram at a stage of the method S1, the method S2 and/or the method S3 in accordance with some embodiments of the present disclosure. After the operation S16, after the operation S26 and/or after the operation S38, a patterning is performed on the substrate 11 using the first patterned layer 126 and the second patterned layer 146 as a mask. In some embodiments, the patterning includes an ion beam etching, a directional dry etching, a reactive ion etching, a solution wet etching, or a combination thereof. As described above, the substrate 11 depicted in FIG. 18 may represent only the topmost layer of the substrate 11. In some embodiments, a portion of the topmost layer of the substrate 11 exposed through the gap 35 is removed. In some embodiments, a pattern of the first patterned layer 126 and the second patterned layer 146 is transferred to the topmost layer of the substrate 11, thereby forming a patterned substrate 111. In some embodiments, a material of the topmost layer of the substrate 11 is different from that of the first patterned layer 126 and/or that of the second patterned layer 146. In some embodiments, the material of the topmost layer of the substrate 11 is different from that of the segmental layer 132.

Figure 19:
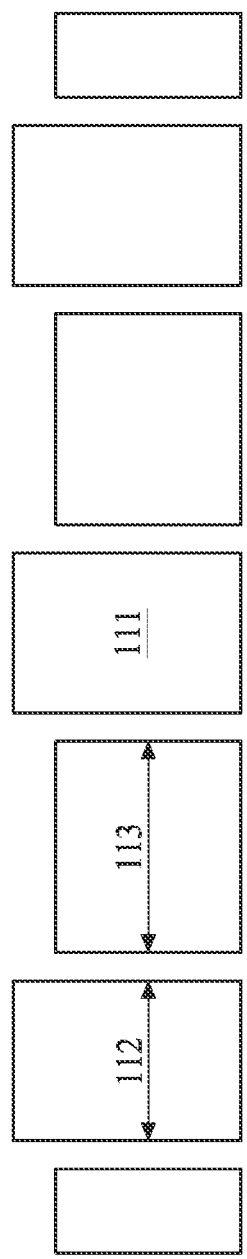

Referring to FIG. 19, FIG. 19 is a schematic cross-sectional diagram at a stage of the method S1, the method S2 and/or the method S3 in accordance with some embodiments of the present disclosure. After the patterning of the substrate 11, the first patterned layer 126, the second patterned layer 146 and the segmental layer 132 are removed, and a semiconductor structure 10 is thereby formed. In some embodiments, one or more etchings are performed to remove the first patterned layer 126, the second patterned layer 146 and the segmental layer 132 individually or concurrently. In some embodiments, the one or more etchings include an ion beam etching, a dry etching, a reactive ion etching, a solution wet etching, or a combination thereof. In some embodiments, the removal of the first patterned layer 126, the second patterned layer 146 and the segmental layer 132 includes a lift-off operation. In some embodiments, a post-cleaning operation is performed on the semiconductor structure 10 shown in FIG. 19 after the removal of the first patterned layer 126, the second patterned layer 146 and the segmental layer 132. In some embodiments, a top surface 111A of the patterned substrate 111 includes recessed portions corresponding to positions of the recesses 182 shown in FIG. 8. In some embodiments, a thickness of portions of the patterned substrate 111 defined by the second patterned layer 146 is less than a thickness of portions of the patterned substrate 111 defined by the first patterned layer 126 shown in FIG. 18.

Widths, lengths, and/or configurations of different portions of the patterned substrate 111 can be defined by the first patterned layer 126 and the second patterned layer 146. For instance, widths of adjacent portions of the patterned substrate 111 are defined by adjacent portions of the first patterned layer 126 and the second patterned layer 146. It should be noted that a width 127 of a portion of the first patterned layer 126 and a width 147 of a portion of the second patterned layer 146 can be controlled and adjusted according to different applications. In some embodiments, the width 127 is substantially less than the width 147 as shown in FIG. 18. In some embodiments, widths of different portions (e.g., 112 and 113 shown in FIG. 19 indicate widths of two adjacent portions of the patterned substrate 111) are substantially different. In alternative embodiments, a width 127 of a portion of the first patterned layer 126 and a width 147 of a portion of the second patterned layer 146 are substantially equal.

Due to a property of a directional dry etching, corner portions of portions of the first patterned layer 121 and corner portions of portions of the second patterned layer 141 may be removed by the third etching 53. In a conventional method without formation of inclined members 122 and 142, a configuration of the patterned layer is changed after a removal of vertical portions of a conformal layer, and a result of the subsequent patterning is affected. The lost material and changed configuration can lead to irregular shapes of the patterned substrate, and therefore cause instabilities and possible defect to subsequent processing. The first inclined member 122 and the second inclined member 142 serve a purpose of preventing changing of the configuration of the patterned layers, and therefore a better patterning result can be provided.

FIGS. 20 to 25 are schematic diagrams illustrating various fabrication stages constructed according to the method S1, S2 or S3 for manufacturing a semiconductor structure 20 in accordance with alternative embodiments of the present disclosure. The stages shown in FIGS. 20 to 25 are also illustrated schematically in the process flow in FIG. 1, 2 or 3. In the subsequent discussion, the fabrication stages shown in FIGS. 20 to 25 are discussed in reference to the process steps in FIG. 1, 2 or 3.

For ease of illustration, reference numerals with similar or same functions and properties are repeated in different embodiments and figures. For a purpose of brevity, in the following specification, only differences from the embodiments illustrated above are emphasized, and descriptions of similar or same elements, functions, properties and/or processing are omitted.

Figure 20:
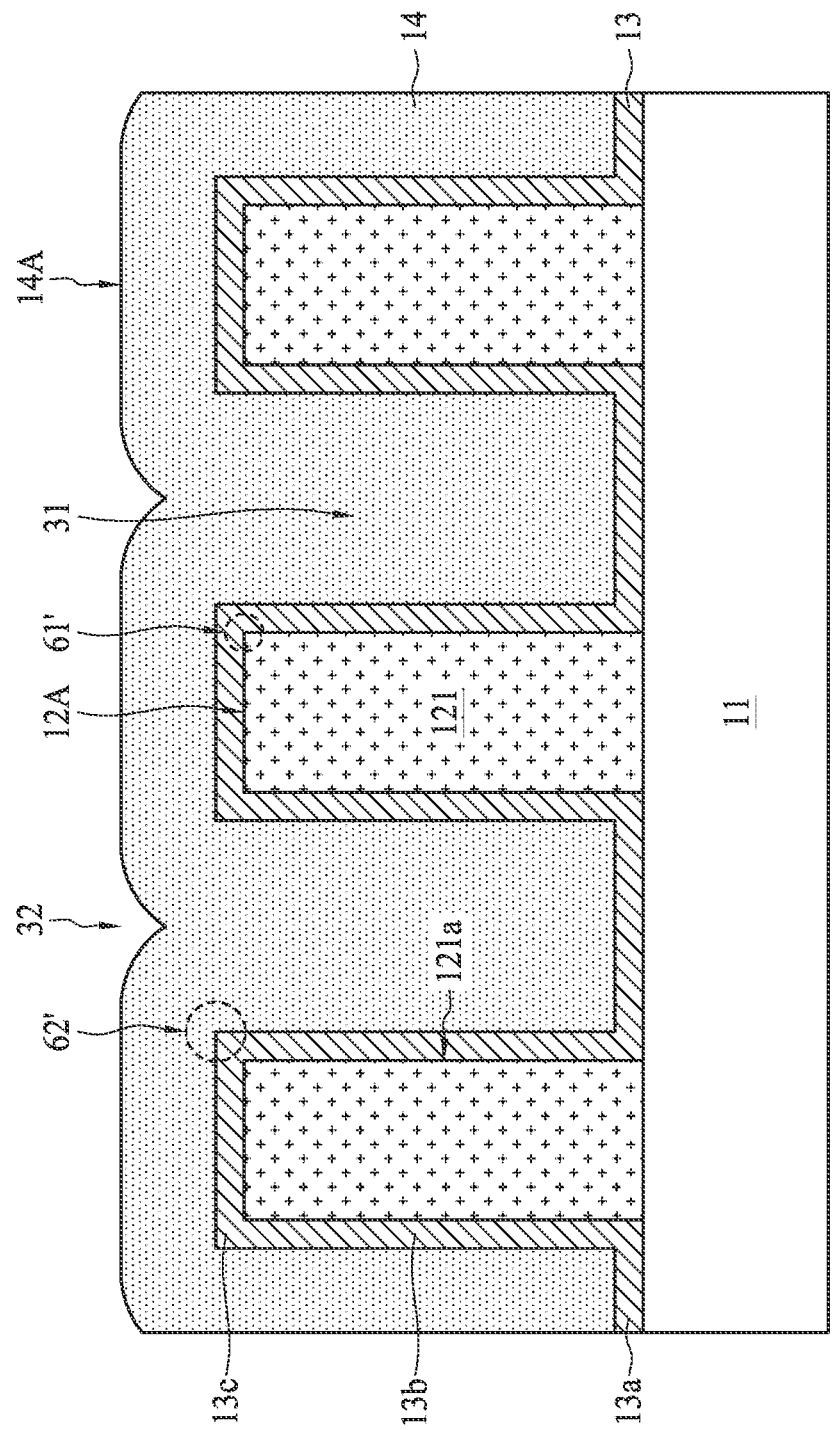
FIGS. 20 to 25 are cross-sectional diagrams of intermediate stages in the formation of a semiconductor structure in accordance with some embodiments of the present disclosure.

Referring to FIG. 20, FIG. 20 is a schematic cross-sectional diagram at a stage of the method S1, the method S2 and/or the method S3 in accordance with some embodiments of the present disclosure. In some embodiments, the formation of the recesses 182 shown in FIG. 8 is omitted, and operations similar to those illustrated in FIGS. 9 to 10 are applied to an interim structure similar to that shown in FIG. 7. A conformal layer 13 and a second layer 14 are sequentially formed over a first patterned layer 121 to form an interim structure as shown in FIG. 20. In some embodiments, the first patterned layer 121 includes sharp corners 61' instead of the rounded corners 61 as shown in FIG. 9. In some embodiments, the conformal layer 13 includes sharp corners 62' instead of the rounded corners 62 as shown in FIG. 9. In some embodiments, the conformal layer 13 includes horizontal portions 13a lining the top surface 11A of the substrate 11, horizontal portions 13c lining a top surface 12A of the first patterned layer 121, and vertical portions 13b connecting the horizontal portions 13a and the horizontal portions 13c. In some embodiments, the conformal layer 13 lines the openings 31. In some embodiments, the conformal layer 13 lines sidewalls 121A of portions of the first patterned layer 121 and a portion of the top surface 11A of the substrate 11 in the openings 31. In some embodiments, the conformal layer 13 is in contact with the top surface 12A of the first patterned layer 121, the sidewall 121A of the first patterned layer 121, and the top surface 11a of the substrate 11.

Figure 21:
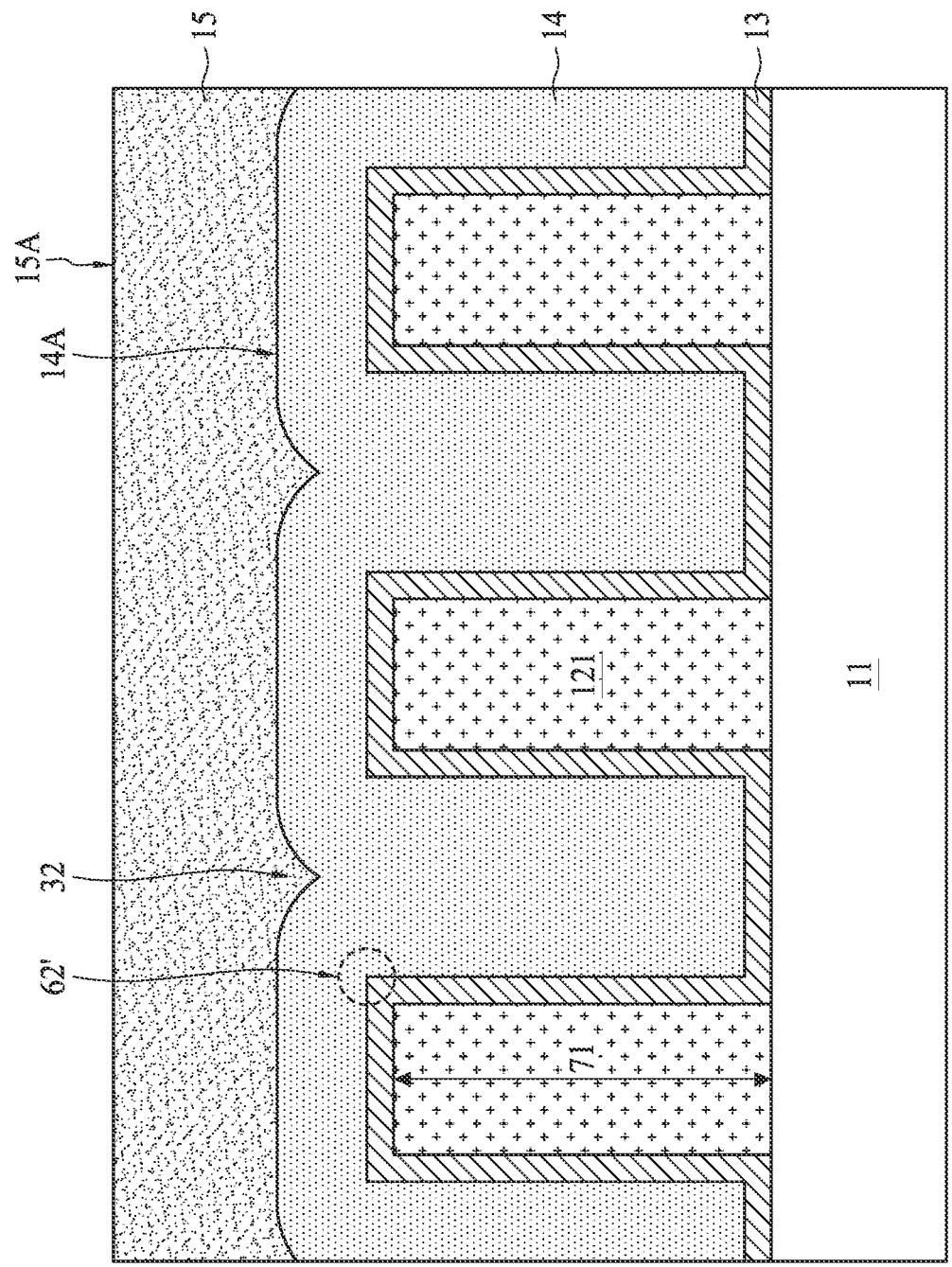

Referring to FIG. 21, FIG. 21 is a schematic cross-sectional diagram at a stage of the method S1, the method S2 and/or the method S3 in accordance with some embodiments of the present disclosure. Operations similar to those illustrated in FIG. 11 are applied to the structure as shown in FIG. 20, and a sacrificial layer 15 is formed over the second layer 14. In some embodiments, the sacrificial layer 15 and the second layer 14 shown in FIG. 21 is similar to the sacrificial layer 15 and the second layer 14 shown in FIG. 11. In some embodiments, the second layer 14 covers the sharp corners 62' of the conformal layer 13. In some embodiments, the second layer 14 is in physical contact with the sharp corners 62' of the conformal layer 13.

Figure 22:
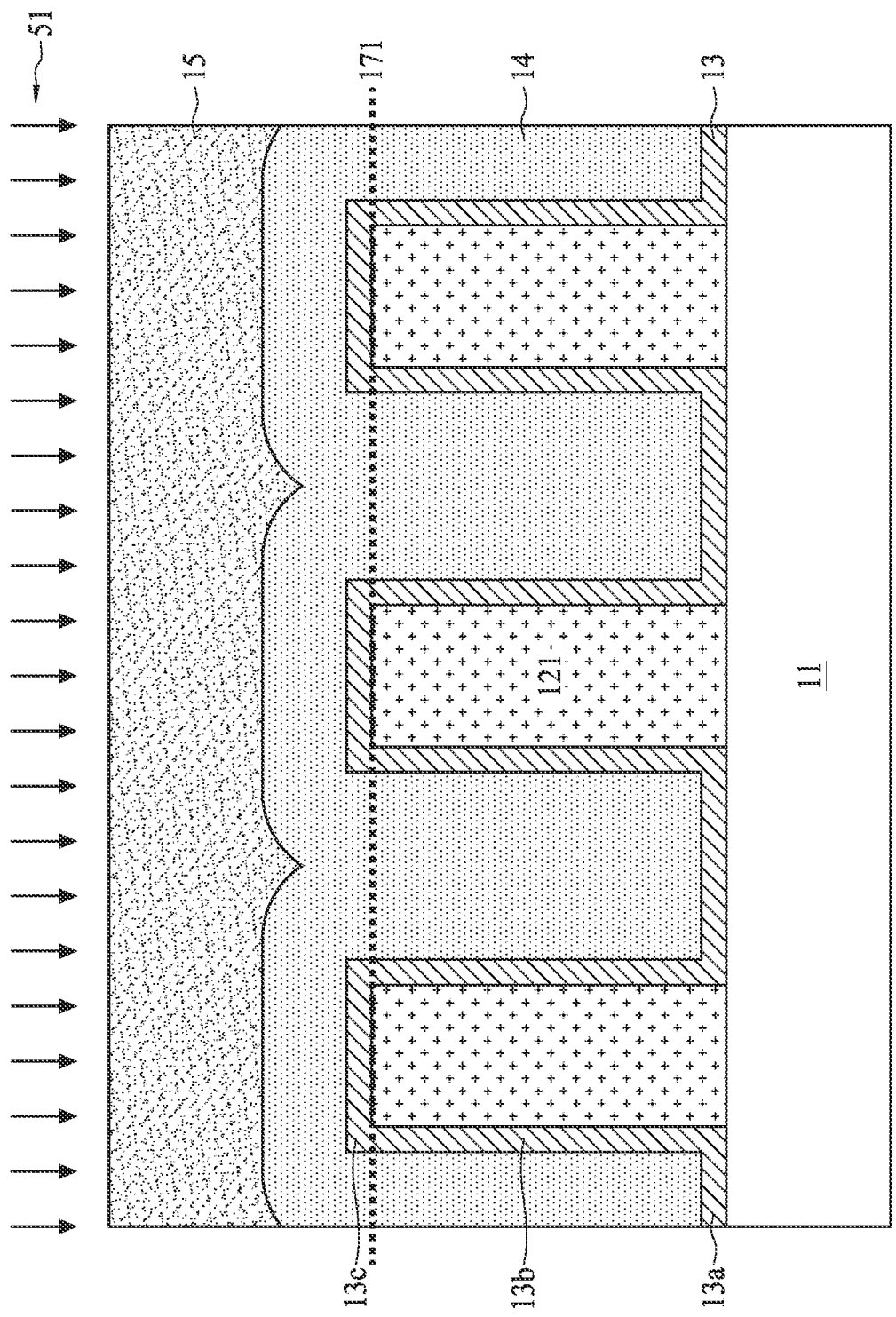
Figure 23:
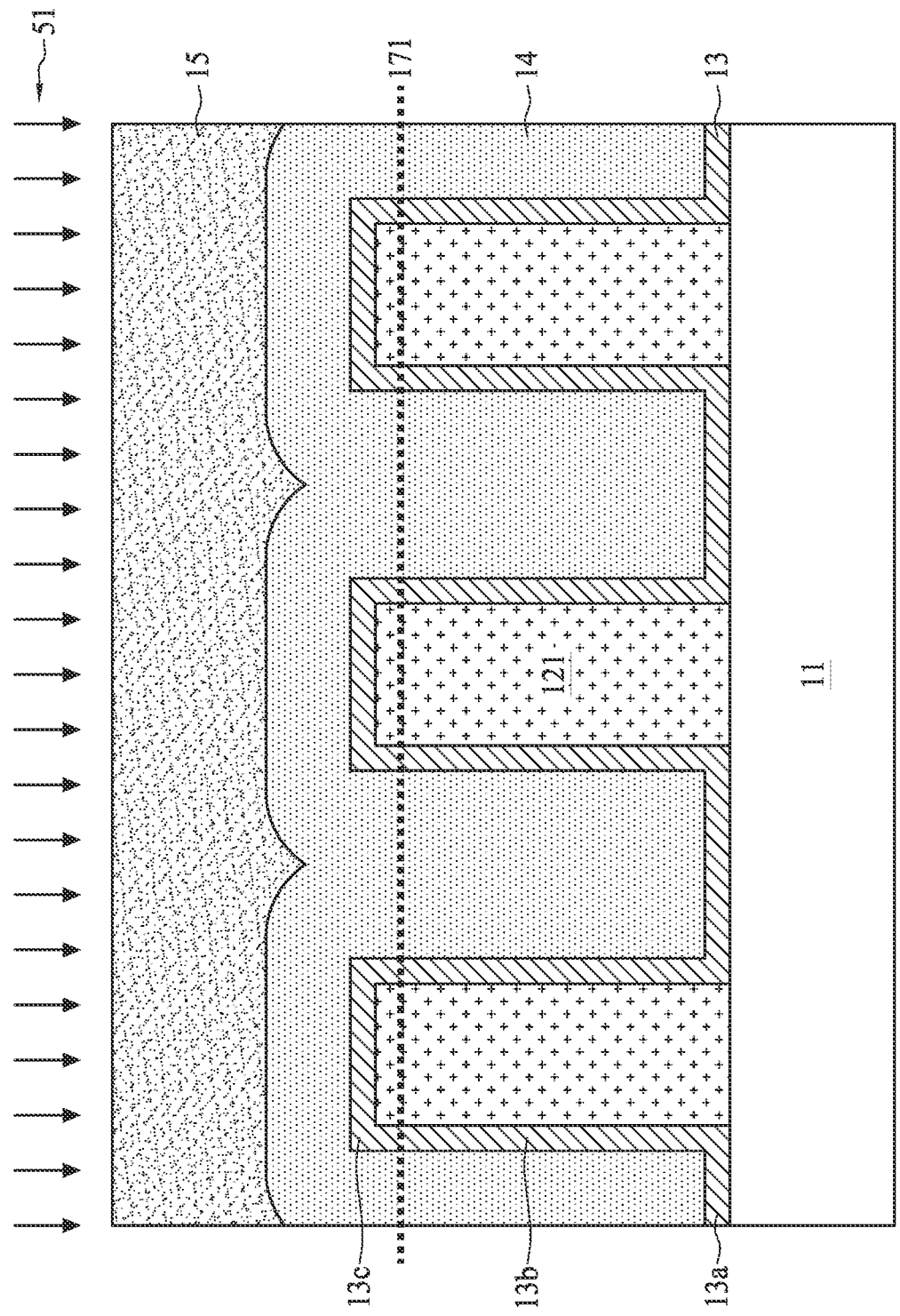

Referring to FIGS. 22 and 23, FIGS. 22 and 23 are schematic cross-sectional diagrams at a stage of the method S1, the method S2 and/or the method S3 in accordance with different embodiments of the present disclosure. A first etching 51 is performed on the structure as shown in FIG. 22. In some embodiments, the first etching 51 stops at an exposure of the top surface 12A of the first patterned layer 121. In some embodiments, portions of the second layer 14 and portions of the conformal layer 13 above the top surface 12A of the first patterned layer 121 are removed. In some embodiments, the first etching 51 stops at a line 171. In some embodiments, only the horizontal portions 13c of the conformal layer 13 are removed. In some embodiments as shown in FIG. 22, the line 171 is at the top surface 12A of the first patterned layer 121; therefore, a material loss of the first patterned layer 121 can be minimized. In some embodiments, the horizontal portions 13c and upper portions of the vertical portions 13b of the conformal layer 13 are removed. In some embodiments as shown in FIG. 23, the line 171 is below the top surface 12A of the first patterned layer 121; therefore, exposure of an entirety of the top surface 12A of the first patterned layer 121 is ensured.

Figure 24:
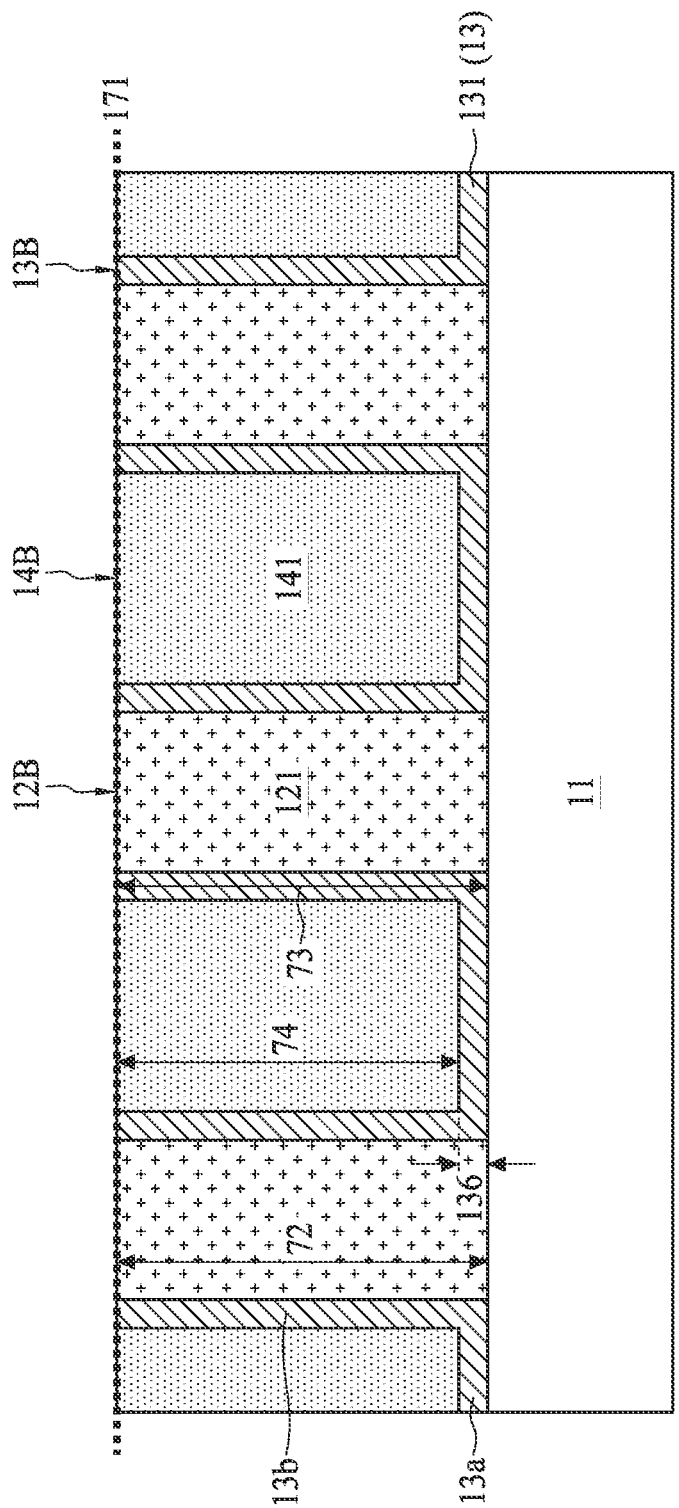

Referring to FIG. 24, FIG. 24 is a schematic cross-sectional diagram at a stage of the method S1, the method S2 and/or the method S3 in accordance with some embodiments of the present disclosure. FIG. 24 shows a resulting structure of the first etching 51 performed on the interim structure as shown in FIG. 21. In some embodiments, a thickness 72 of the first patterned layer 121 is substantially equal to a thickness 71 of the first patterned layer 121 prior to the first etching 51 shown in FIG. 21 if the first etching 51 stops at the line 171 shown in FIG. 22. In some embodiments, the thickness 72 of the first patterned layer 121 is substantially less than the thickness 71 of the first patterned layer 121 prior to the first etching 51 if the first etching 51 stops at the line 171 shown in FIG. 23. In some embodiments, a thickness 74 of the second patterned layer 141 is substantially less than the thickness 72 of the first patterned layer 121. In some embodiments, a height 73 of the patterned conformal layer 131 is substantially equal to the thickness 72. In some embodiments, the thickness 72 is substantially equal to a total thickness of the second patterned layer 141 (having the thickness 74) and the patterned conformal layer 131 (having a thickness 136).

Figure 25:
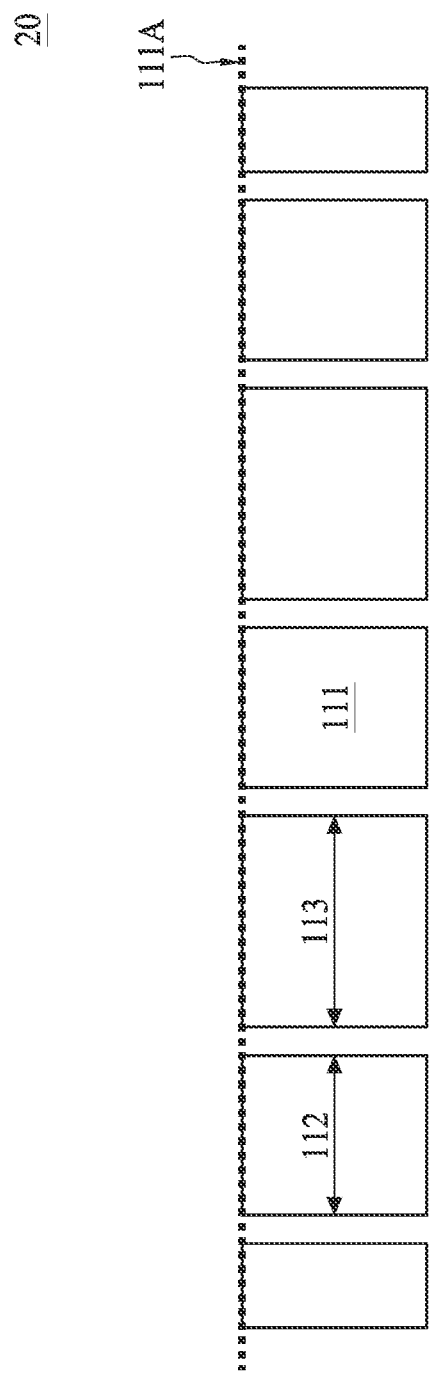

Referring to FIG. 25, FIG. 25 is a schematic cross-sectional diagram at a stage of the method S1, the method S2 and/or the method S3 in accordance with some embodiments of the present disclosure. Operations similar to those illustrated in FIGS. 14 and 17 to 19 are sequentially performed on the intermediate structure of FIG. 24 to form a semiconductor structure 20. In some embodiments, a top surface 111A of a patterned substrate 111 is substantially planar.

One aspect of the present disclosure provides a method of manufacturing a semiconductor structure. The method includes forming a first patterned layer over a substrate; forming a conformal layer over the first patterned layer; forming a second layer over the conformal layer and between portions of the first patterned layer; performing a first etching to remove portions of the second layer and the conformal layer disposed over the first patterned layer, thereby forming a second patterned layer and a patterned conformal layer; performing a second etching to form a first inclined member of the first patterned layer tapered away from the substrate and lining a vertical portion of the patterned conformal layer, and to form a second inclined member of the second patterned layer tapered away from the substrate and lining the vertical portion of the patterned conformal layer; and performing a third etching to remove the vertical portions of the patterned conformal layer.

Another aspect of the present disclosure provides a method of manufacturing a semiconductor structure. The method includes forming a first patterned layer over a substrate; forming a second patterned layer over the substrate and alternately arranged with the first patterned layer; forming a patterned conformal layer disposed between the first patterned layer and the second patterned layer, wherein top surfaces of the first patterned layer, the patterned conformal layer, and the second patterned layer are substantially coplanar; forming a first recess extending into the first patterned layer and surrounded by the patterned conformal layer; removing vertical portions of the patterned conformal layer; and planarizing top surfaces of the first patterned layer and the second patterned layer.

Another aspect of the present disclosure provides a method of manufacturing a semiconductor structure. The method includes providing a substrate; forming a first layer over the substrate; patterning the first layer to form a first patterned layer and to expose portions of the substrate; forming a conformal layer over the first patterned layer and the substrate; forming a second layer over the conformal layer, wherein the second layer at least fills between different portions of the first patterned layer; removing portions of the conformal layer and the second layer disposed over the first patterned layer to form a patterned conformal layer and a second patterned layer, wherein top surface of the first patterned layer, the second patterned layer and the patterned conformal layer are substantially coplanar; performing a first etching to form a first recess on the first patterned layer and a second recess on the second patterned layer, wherein each of the first recess and the second recess is surrounded by the patterned conformal layer; and performing a second etching to remove portions of the patterned conformal layer to separate the first patterned layer and the second patterned layer with a plurality of gaps.

In conclusion, the application discloses a manufacturing method of a semiconductor structure. An etching operation is performed on patterned layers prior to transferring a pattern of the patterned layers, and inclined members are formed at corner portions of the patterned layers. A presence of the inclined members can protect a desired configuration of the patterned layers and provide improvement of a patterning result.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a semiconductor structure, comprising:
    forming a first patterned layer over a substrate;
    forming a conformal layer over the first patterned layer;
    forming a second layer over the conformal layer and between portions of the first patterned layer;
    performing a first etching to remove portions of the second layer and the conformal layer disposed over the first patterned layer, thereby forming a second patterned layer and a patterned conformal layer;
    performing a second etching to form a first inclined member of the first patterned layer tapered away from the substrate and lining a vertical portion of the patterned conformal layer, and to form a second inclined member of the second patterned layer tapered away from the substrate and lining the vertical portion of the patterned conformal layer; and
    performing a third etching to remove the vertical portions of the patterned conformal layer.

2. The method of claim 1, further comprising:
    providing the substrate; and
    forming a plurality of recesses in the substrate.

3. The method of claim 2, wherein the plurality of recesses are filled by the conformal layer.

4. The method of claim 1, further comprising:
    forming a first layer over the substrate; and
    removing portions of the first layer to form the first patterned layer.

5. The method of claim 4, wherein the first patterned layer includes rounded corners.

6. The method of claim 5, wherein the first etching stops when the rounded corners of the first patterned layer are entirely removed.

7. The method of claim 5, wherein rounded corners of the conformal layer are disposed over the rounded corners of the first patterned layer.

8. The method of claim 7, wherein the first etching stops when the rounded corners of the conformal layer are entirely removed.

9. The method of claim 1, wherein the first etching is a low-selectivity etching.

10. The method of claim 1, wherein the second etching or the third etching is a high-selectivity etching.

11. The method of claim 1, wherein a first etching rate of the low-selectivity etching to the first patterned layer is substantially equal to a second etching rate of the low-selectivity etching to the conformal layer.

12. The method of claim 1, wherein the first inclined member and the second inclined member are removed by the third etching.

13. The method of claim 1, wherein a top surface of the first patterned layer is substantially coplanar with a top surface of the second patterned layer after the third etching.

14. A method of manufacturing a semiconductor structure, comprising:
    forming a first patterned layer over a substrate;
    forming a second patterned layer over the substrate and alternately arranged with the first patterned layer;
    forming a patterned conformal layer between the first patterned layer and the second patterned layer, wherein top surfaces of the first patterned layer, the patterned conformal layer, and the second patterned layer are substantially coplanar;
    forming a first recess extending into the first patterned layer and surrounded by the patterned conformal layer;
    removing vertical portions of the patterned conformal layer;
    planarizing top surfaces of the first patterned layer and the second patterned layer;
    forming a plurality of recesses on the substrate prior to the formation of the first patterned layer; and
    forming a conformal layer prior to the formation of the second patterned layer, wherein the conformal layer is conformal to the substrate and the first patterned layer.

15. The method of claim 14, wherein sidewalls of the first patterned layer are substantially aligned with sidewalls of the plurality of recesses on the substrate.

16. The method of claim 14, wherein at least a portion of the patterned conformal layer is disposed below the first patterned layer.

17. The method of claim 14, further comprising:
    forming a second recess extending into the second patterned layer, concurrently with the formation of the first recess.

18. The method of claim 14, wherein the first recess is formed by a dry etching.

19. A method of manufacturing a semiconductor structure, comprising:
    providing a substrate;
    forming a first layer over the substrate;
    patterning the first layer to form a first patterned layer and to expose portions of the substrate;
    forming a conformal layer over the first patterned layer and the substrate;
    forming a second layer over the conformal layer, wherein the second layer at least fills between different portions of the first patterned layer;

removing portions of the conformal layer and the second layer disposed over the first patterned layer to form a patterned conformal layer and a second patterned layer, wherein top surfaces of the first patterned layer, the second patterned layer and the patterned conformal layer are substantially coplanar;

performing a first etching to form a first recess on the first patterned layer and a second recess on the second patterned layer, wherein each of the first recess and the second recess is surrounded by the patterned conformal layer; and performing a second etching to remove vertical portions of the patterned conformal layer to separate the first patterned layer and the second patterned layer with a plurality of gaps.

* * * * *